United States Patent [19]
Furutani

[11] Patent Number: 5,901,102
[45] Date of Patent: May 4, 1999

[54] SEMICONDUCTOR MEMORY DEVICE ACHIEVING REDUCTION IN ACCESS TIME WITHOUT INCREASE IN POWER CONSUMPTION

[75] Inventor: Kiyohiro Furutani, Hyogo, Japan

[73] Assignee: Mitsubishi Denki Kabushiki Kaisha, Tokyo, Japan

[21] Appl. No.: 08/746,956

[22] Filed: Nov. 18, 1996

[30] Foreign Application Priority Data

Nov. 17, 1995 [JP] Japan ..................................... 7-299821

[51] Int. Cl.⁶ ........................................................ G11C 7/00
[52] U.S. Cl. ...................................... 365/226; 365/189.09
[58] Field of Search .............................. 365/226, 189.11, 365/189.07, 189.09

[56] References Cited

U.S. PATENT DOCUMENTS 5,349,559  9/1994  Park .......................................... 365/226
5,361,000  11/1994  Koshikawa ................................ 365/226
5,694,364  12/1997  Morishita .................................. 365/226

OTHER PUBLICATIONS

"An Experimental 1 Mbit DRAM Based on high S/N Design", R. Hori et al., IEEE Journal of Solid–State Circuits, vol. Sc–19, No. 5, Oct. 1984, pp. 634–639.

"A 34–ns 16–Mb DRAM with Controllable Voltage Down–Converter", H. Hidaka et al. IEEE Journal of Solid–State Circuits, vol. 27, No. 7 Jul. 1992, pp. 1020–1027.

Primary Examiner—A. Zarabian
Attorney, Agent, or Firm—McDermott, Will & Emery

[57] ABSTRACT

Internal power supply voltage Vint is generated from internal high voltage Vpp used for word line driving or the like, using an n channel MOS transistor which operates in a source follower mode. During operation of internal circuitry, gate potential of this source follower transistor is boosted by charge pumping operation of a capacitor. Thus, conductance of the source follower mode transistor can be increased during operation of the internal circuitry without using an internal high voltage generating circuit dedicated to generation of internal power supply voltage.

19 Claims, 13 Drawing Sheets

FIG.4
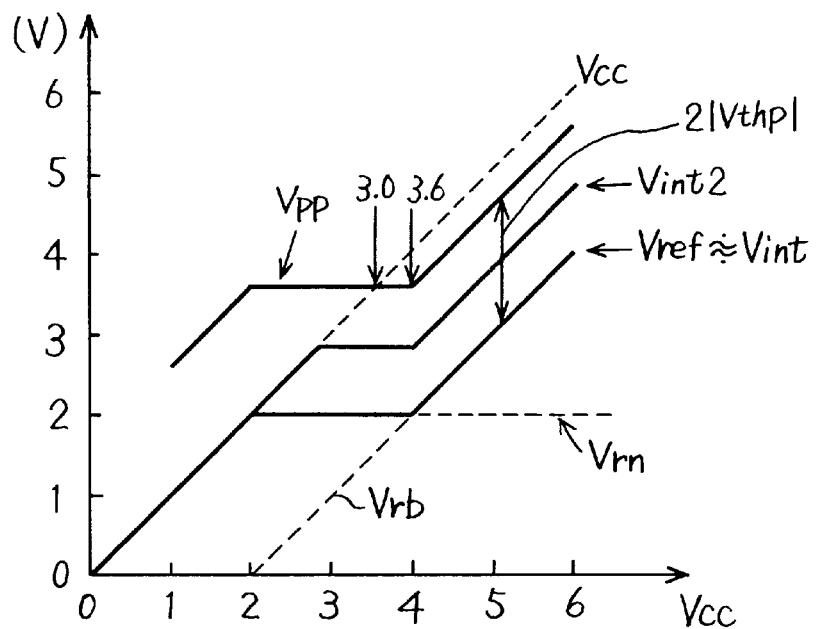
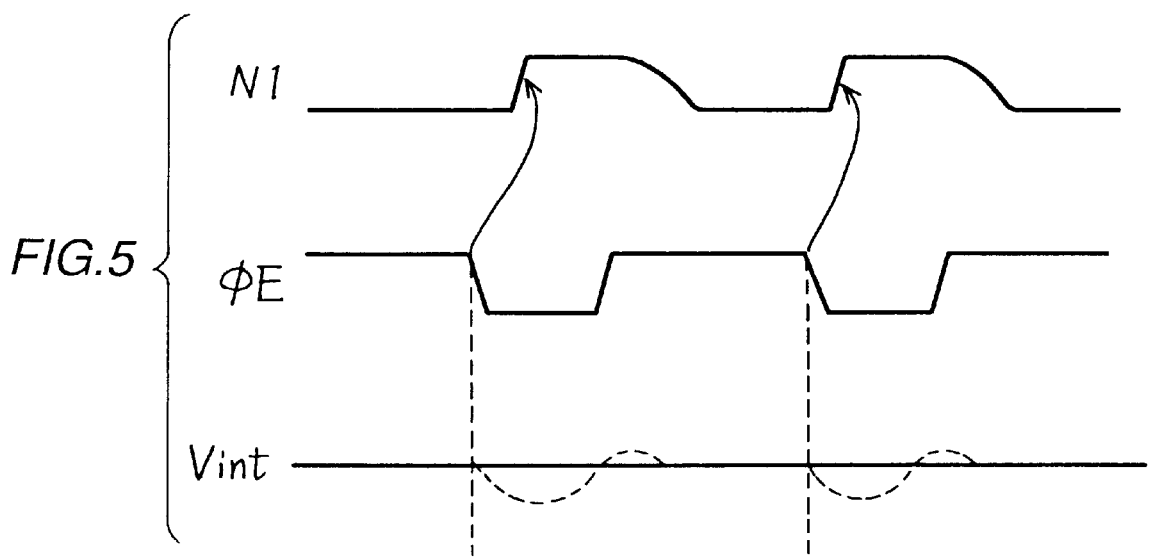
FIG.5

SEMICONDUCTOR MEMORY DEVICE ACHIEVING REDUCTION IN ACCESS TIME WITHOUT INCREASE IN POWER CONSUMPTION

BACKGROUND OF THE INVENTION

1. Field of the Invention

The present invention relates to a semiconductor device, and more particularly, to a structure of a semiconductor memory device intended to reduce access time and power consumption thereof.

2. Description of the Background Art

In order to reduce power consumption of a semiconductor device such as a semiconductor memory device, it is effective to reduce power supply voltage Vcc supplied to the semiconductor device. This is because internal resistance is constant and power consumption is proportional to the square of the power supply voltage Vcc. However, compatibility of the semiconductor device with a semiconductor memory device which operates with power supply voltage which has not been reduced as operating power supply voltage must be maintained. Therefore, an internal voltage down-converter for down-converting externally supplied power supply voltage (hereinafter simply referred to as power supply voltage) Vcc to produce internal power supply voltage (hereinafter simply referred to as internal power supply) Vint which is lower than the power supply voltage Vcc is generally provided inside the semiconductor memory device. The semiconductor memory device is made to operate by the internal power supply Vint produced by the internal voltage down-converter.

FIG. 15 is a schematic diagram showing a structure of a conventional internal voltage generating circuit. FIG. 15 shows, together with the circuit for generating internal power supply Vint, a structure of a portion for generating internal high voltage Vpp which is higher than the internal power supply Vint. The circuit portion for generating internal power supply Vint and internal high voltage Vpp is hereinafter referred to as an internal voltage generating circuit.

The internal voltage generating circuit in FIG. 15 includes a constant current source 202 for supplying constant current; a reference potential generating circuit 203 for receiving constant current Ir from constant current source 202, and generating a reference potential Vref at a fixed voltage level which does not depend on power supply voltage Vcc when the power supply voltage Vcc is in a prescribed range; an internal power supply generating circuit 204 for generating internal power supply Vint on an internal power supply node 204x according to the reference potential Vref; and an internal high voltage generating circuit 205 for receiving the reference potential Vref and generating internal high voltage Vpp by charge pumping operation. The voltage level of internal high voltage Vpp is determined by the voltage level of reference potential Vref.

Internal power supply generating circuit 204 includes a differential amplifier 204a for differentially amplifying internal power supply Vint on internal power supply node 204x and reference potential Vref; a drive transistor 204b constituted by a p channel MOS transistor (an insulated gate type field effect transistor) coupled between an external power supply node EV and internal power supply node 204x and having its gate receiving an output signal from the differential amplifier 204a; a differential amplifier 204c activated upon activation of a row address strobe signal RAS, for differentially amplifying internal power supply Vint on internal power supply node 204x and reference potential Vref; a drive transistor 204d constituted by a p channel MOS transistor coupled between external power supply node EV and internal power supply node 204x and having its gate receiving an output signal from the differential amplifier 204c; and a p channel MOS transistor 204e coupled between external power supply node EV and the gate of drive transistor 204d and having its gate receiving row address strobe signal RAS. Differential amplifier 204a always operates, and increases conductance of drive transistor 204b by outputting a signal at a low level and supplies current from external power supply node EV to internal power supply node 204x when internal power supply Vint is lower than reference potential Vref. Since differential amplifier 204a operates at all times, it is made to have a small current driving capability in order to reduce current consumption thereof.

Differential amplifier 204c operates when row address strobe signal RAS is active. When the row address strobe signal RAS is inactive, that is, the semiconductor memory device is on standby, differential amplifier 204c is in a non-operative state. Differential amplifier 204c is made to have a large current driving capability. When the row address strobe signal RAS is active and internal circuitry operates consuming internal power supply Vint, differential amplifier 204c quickly responds to drive the drive transistor 204d to supply relatively large current from external power supply node EV to internal power supply node 204x through drive transistor 204d. Thus, reduction in internal power supply Vint during operation of the internal circuitry is suppressed. MOS transistor 204e is rendered conductive when the row address strobe signal RAS is inactive (at an L level), and supplies power supply voltage Vcc applied to external power supply node EV to the gate of drive transistor 204d, whereby it is ensured that drive transistor 204d is kept off. Thus, a current flowing path through drive transistor 204d is cut off during standby.

FIG. 16 is a diagram showing a structure of differential amplifiers 204a and 204c shown in FIG. 15. In FIG. 16, differential amplifier 204a includes a p channel MOS transistor 204aa connected between external power supply node EV and an internal node 204ax; a p channel MOS transistor 204ab connected between external power supply node EV and an internal node 204ay; an n channel MOS transistor 204ac connected between internal node 204ax and an internal node 204az and having its gate receiving reference potential Vref; an n channel MOS transistor 204ad connected between internal node 204ay and internal node 204az and having its gate receiving internal power supply Vint; and an n channel MOS transistor 204ae connected between internal node 204az and a ground node and having its gate receiving constant voltage Vcs. The constant potential Vcs is applied from constant current source 202 shown in FIG. 15, and MOS transistor 204ae functions as a current source.

Voltage to be applied to the gate of drive transistor 204b is output from internal node 204ax. MOS transistors 204aa and 204ab constitute a current mirror circuit, and MOS transistors 204ac and 204ad constitute a comparison stage. In this differential amplifier 204a, the gate of transistor 204a receives constant potential Vcs, and the supplying current thereof is reduced. Therefore, driving current (current flowing from external power supply node EV to the ground node) of differential amplifier 204a is reduced.

Differential amplifier 204c includes a p channel MOS transistor 204ba connected between external power supply node EV and an internal node 204bx and having its gate connected to an internal node 204by; a p channel MOS transistor 204*bb* connected between external power supply node EV and internal node 204*by* and having its gate connected to internal node 204*by*; an n channel MOS transistor 204*bc* connected between internal node 204*bx* and an internal node 204*bz* and having its gate receiving reference potential Vref; an n channel MOS transistor 204*bd* connected between internal node 204*by* and internal node 204*bz* and having its gate receiving internal power supply Vint; and an n channel MOS transistor 204*be* connected between internal node 204*bz* and the ground node and having its gate receiving the row address strobe signal RAS. MOS transistors 204*ba* and 204*bb* constitute a current mirror circuit, and MOS transistors 204*bc* and 204*bd* constitute a comparison stage.

Row address strobe signal RAS applied to the gate of current source transistor 204*be* varies between internal power supply Vint and ground potential. Therefore, current source transistor 204*be* is turned on completely when being conductive, and conductance thereof is made sufficiently larger than that of current source transistor 204*ae*. Furthermore, current supplying capability (channel width) of transistors included in differential amplifier 204*c* is also made relatively superior to (larger than) that of transistors in differential amplifier 204*a*. When row address strobe signal RAS attains an H level, internal circuitry of the semiconductor memory device operates and internal power supply Vint is reduced, differential amplifier 204*b* operates at a high speed, reducing the voltage level applied to internal node 204*bx*. Thus, conductance of drive transistor 204*d* rapidly increases, compensating for the reduction in internal power supply Vint, so that internal power supply Vint is returned to the reference potential Vref level.

In the case of the structure of the internal voltage generating circuit shown in FIGS. 15 and 16, differential amplifier 204*c* having large driving capability operates when row address strobe signal RAS is active. Accordingly, power consumption of differential amplifier 204*c* is large, and reduction in current consumption and power consumption of the entire semiconductor memory device cannot be achieved.

FIG. 17 is a diagram showing another structure of a conventional internal voltage generating circuit. The internal voltage generating circuit shown in FIG. 17 operates with power supply voltage Vcc on an external power supply node EV as operating power supply voltage, and includes a charge pumping circuit 210 for generating an internal voltage on a node N1 by charge pumping operation, a drive transistor 226 constituted by an n channel MOS transistor connected between external power supply node EV and an internal power supply node IV and having its gate connected to node N1, and a p channel MOS transistor 227 connected between node N1 and a ground node and having its gate receiving reference potential Vref from a reference potential generating circuit 203.

Charge pumping circuit 210 includes three stages of inverters 219, 220 and 221 constituting a ring oscillator; an inverter 222 for inverting an output signal of inverter 221; a charge pumping capacitor C1 responsive to an output signal of inverter 222 for performing charge pumping operation to change potential of a node 210*a*; an n channel MOS transistor 224 connected between external power supply node EV and a node 210*a*; a charge pumping capacitor C2 responsive to an output signal of inverter 221 for performing charge pumping operation to change a gate potential of MOS transistor 224; a diode-connected n channel MOS transistor 223 connected between external power supply node EV and the gate of MOS transistor 224; and an n channel MOS transistor 225 connected between node 210*a* and internal node N1 and having its gate connected to internal node 210*a*. This MOS transistor 225 functions as a diode.

MOS transistor 223 functions as a diode, and clamps the gate potential of MOS transistor 224 to the voltage level of Vcc−Vth. Vth is threshold voltage of MOS transistor 224. Charge pumping capacitor C2 causes the gate potential of MOS transistor 224 to change between 2•Vcc−Vth and Vcc−Vth according to the charge pumping operation thereof. MOS transistor 224 transmits power supply voltage Vcc to node 210*a* when the gate potential thereof is 2•Vcc−Vth. Charge pumping capacitor C1 causes potential of internal node 210 to change between 2•Vcc and Vcc according to an output signal of inverter 222. Therefore, voltage of 2•Vcc−Vth is transmitted to node N1 through MOS transistor 225. MOS transistor 227 has threshold voltage Vthp, has its gate receiving reference potential Vref, and operates in a source follower mode. Accordingly, potential of node N1 is clamped to the voltage level of Vref+|Vthp|.

Drive transistor 226 operates in a source follower mode, and keeps the potential difference between the gate (node N1) thereof and internal power supply node IV at the level of threshold voltage Vthn. Therefore, internal power supply Vint is Vref+|Vthp|−Vthn.

The circuit structure shown in FIG. 17 is not provided with a differential amplifier. However, charge pumping circuit 210 operates at all times, resulting in large power consumption thereof. In particular, if the difference between voltage of 2•Vcc−Vthn output from charge pumping circuit 210 and reference potential Vref is large, MOS transistor 227 conducts at all times and supplies current from node N1 to the ground node, and therefore, current is consumed unnecessarily.

In addition, drive transistor 226 operates in a source follower mode, and supplies current from external power supply node EV to internal power supply node IV according to the potential difference between the gate and the source thereof, that is, the potential difference between node N1 and internal power supply node IV. When internal circuitry operates and internal power supply Vint rapidly reduces, large current flows through drive transistor 226. Drive transistor 226 is constituted by an MOS transistor, and has a specific channel resistance determined by its gate potential. Therefore, if relatively large current flows therethrough, the potential level of internal power supply Vint is reduced by the channel resistance of drive transistor 226, and the operating power supply voltage level of the internal circuitry is accordingly decreased, resulting in reduction in operation speed of the internal circuits. Consequently, in this case, the internal circuitry cannot operate stably at a high speed, and high speed access cannot be realized.

FIG. 18 is a diagram showing a structure of a data input/output (I/O) circuit of a semiconductor memory device. FIG. 18 shows a structure of a data I/O portion for 1 bit. In FIG. 18, a data output portion of the data I/O circuit includes an inverter 234 for inverting internal read data R; 2-input NAND circuits 237 and 238 activated in response to a data read instruction signal φO, for inverting internal read data R and output data of inverter 234 to transmit those inverted data to internal nodes Na1 and Na2, respectively; an inverter 235 for inverting a data signal on a node Na1; a capacitor 247 responsive to an output signal of inverter 235 for carrying out charge pumping operation to transmit charges to a node Na3; a diode-connected n channel MOS transistor 240 connected between an internal power supply node IV and node Na3; an n channel MOS transistor 243 connected between external power supply node EV and a data I/O terminal Na4; an n channel MOS transistor 241 connected between the gate of MOS transistor 243 and a ground node and having its gate connected to node Na1; and a p channel MOS transistor 246 connected between node Na3 and the gate of MOS transistor 243 and having its gate connected to node Na1. MOS transistor 243 transmits power supply voltage Vcc on external power supply node EV to data I/O node Na4 when it is rendered conductive.

The data output portion further includes an n channel MOS transistor 244 connected between data I/O node Na4 and the ground node; a p channel MOS transistor 245 connected between internal power supply node IV and the gate of MOS transistor 244 and having its gate connected to node Na2; and an n channel MOS transistor 242 connected between the gate of MOS transistor 244 and the ground node and having its gate connected to node Na2.

A data write portion of the data I/O circuit includes an NAND circuit 239 for receiving a data write instruction signal φI and write data on data I/O node Na4, an inverter circuit 236 for inverting an output signal of NAND circuit 239 to produce internal write data W. Operation will now be described briefly.

First, description of data read operation will be given. When a data read instruction signal φO is inactive at an L level, a potential level on nodes Na1 and Na2 is an H level (an internal power supply Vint level). In this condition, node Na3 is held, by MOS transistor 240, at a voltage level lower than internal power supply Vint by threshold voltage thereof. Therefore, MOS transistor 246 is made turned off, while MOS transistor 241 is made turned on. In addition, MOS transistor 245 is off, while MOS transistor 242 is on. Thus, MOS transistors 243 and 244 of the output portion have respective gate potentials at the ground potential level and are made turn off, and data output node Na4 is forced to be in an output high impedance state.

If the data read instruction signal φO attains an H level, NAND circuits 237 and 238 are enabled. Assuming that internal read data R is now at an H level, potential of node Na1 falls to an L level and an output of inverter 235 rises to an H level. In response to the rise of the output signal of inverter 235, potential on node Na3 rises to the level of 2•Vcc−Vth by the function of charge pumping capacitor 247. Thus, the potential on node Na3 is transmitted to the gate of MOS transistor 243 through MOS transistor 246. At this time, since MOS transistor 241 is off, gate potential of MOS transistor 243 is made at the level of 2•Vcc−Vthn, and the MOS transistor transmits voltage at the Vcc level to data I/O node Na4. At this time, internal node Na2 is at an H level and MOS transistor 244 is off.

When internal read data R is at an L level, potential level on node Na1 is an H level and potential level on internal node Na2 is an L level. In this condition, MOS transistors 246 and 243 are made turned off, while MOS transistor 241 is made turned on (this is the same condition as that in the case where the signal φO is at an L level). On the other hand, MOS transistor 245 is turned on, while MOS transistor 242 is turned off, and gate potential of MOS transistor 244 is set at the internal power supply Vint level. Thus, MOS transistor 244 is turned on, and potential on data I/O node Na4 is discharged to the ground potential level.

In data write operation, write instruction signal φI is activated at an H level. Thus, NAND circuit 239 and inverter 236 as a whole function as a buffer, and buffer write data applied to data I/O node Na4 to produce internal write data W.

In the structure of the data I/O circuit shown in FIG. 18, only the last data output stage is connected to the external power supply node, and other components operate with internal power supply Vint as operating power supply voltage. Interface between a memory and an external device can be achieved by outputting a signal, which swings between the external power supply voltage Vcc level and the ground voltage level, to data I/O node Na4.

However, internal power supply Vint is applied to the gate of MOS transistor 244. The gate potential of MOS transistor 244 is a potential level lower than an H level of data I/O node Na4, and conductance of MOS transistor 244 is reduced, so that data I/O node Na4 cannot be discharged at a high speed. If a channel width of MOS transistor 244 is increased in order to achieve large current driving capability thereof, data I/O node Na4 is accompanied with junction capacitance (substrate-drain capacitance and drain-gate capacitance) of MOS transistor 244 as parasitic capacitance. Therefore, parasitic capacitance of data I/O node Na4 increases, and thus cannot satisfy the capacitance value of, for example, 7pF at data I/O node Na4 determined by the specification value, so that quick charge/discharge of data I/O node Na4 cannot be achieved. In particular, data I/O node Na4 is also used for writing of data, and an external device cannot charge/discharge data I/O node Na4 quickly if this parasitic capacitance increases, so that the data writing speed is accordingly reduced. Consequently, if internal power supply Vint is reduced, data cannot be input/output at a high speed, resulting in difficulty in implementation of a semiconductor memory device which operates at a high speed.

SUMMARY OF THE INVENTION

It is an object of the present invention to provide a semiconductor memory device capable of stably supplying internal power supply with low power consumption.

It is another object of the present invention to provide a semiconductor device and a semiconductor memory device which operate stably at a high speed.

It is a further object of the present invention to provide a semiconductor device which operates at a high speed with low power consumption.

It is a still further object of the present invention to provide a semiconductor device capable of outputting data at a high speed even with low internal power supply.

A semiconductor memory device in accordance with one aspect of the present invention includes a circuit for receiving internal high voltage higher than internal power supply voltage used in another circuit and generating a driving voltage corresponding to the received internal high voltage, and a drive transistor coupled between a power supply node and an internal power supply node for supplying charges from the power supply node to the internal power supply node according to the difference between the generated driving voltage and voltage on the internal power supply node.

A semiconductor device in accordance with another aspect of the present invention includes a plurality of power supply pads located on a semiconductor chip, and a plurality of internal power supply voltage generating circuits respectively corresponding to the plurality of power supply pads and each provided in the vicinity of a corresponding power supply pad, for receiving power supply voltage from a corresponding power supply pad and converting the power supply voltage to generate internal power supply voltage.

A semiconductor device in accordance with a further aspect of the present invention further includes, in addition to the arrangement of the device of the first aspect a second driving circuit for operating with external power supply voltage on an external power supply node as one operating power supply voltage, receiving second data, and producing second driving voltage corresponding to the second data and having logic complementary to that of the first driving voltage; a first drive transistor coupled between an internal power supply node and a data output node and responsive to the first driving voltage for transmitting voltage on the external power supply node to the data output node; and a second drive transistor coupled between the data output node and a third power supply node which receives power supply voltage which is different in logic from voltages on the external and the internal power supply nodes, and responsive to the second driving voltage for conducting complementarily to the first drive transistor and transmitting the voltage on the third power supply node to the data output node.

In the semiconductor memory device in accordance with the above mentioned first aspect of the present invention, internal high voltage is transmitted on the internal power supply node in a source follower mode to produce internal power supply voltage and a differential amplifier for comparing internal power supply voltage with reference potential is not required, and therefore, power consumption can be reduced. In addition, since internal power supply voltage is generated utilizing internal high voltage used for word line selection or the like, a high voltage generating circuit dedicated to generation of internal power supply voltage is not necessary, so that power consumption as well as area occupied by circuits can be reduced. Furthermore, conductance of the drive transistor can be increased by supplying charges to a control electrode node of the drive transistor during operation of the internal circuitry, and therefore, reduction in internal power supply during operation of the internal circuitry can be compensated for by large current driving capability and low resistance.

In accordance with the above mentioned another aspect of the present invention, since internal power supply voltage generating circuits are provided respectively corresponding to the plurality of power supply pads and each located in the vicinity of a corresponding power supply pad, external power supply is supplied stably and internal power supply voltage can be produced. In addition, the power supply pads are selectively connected to external power supply terminals according to the number of data I/O bits, whereby the number of internal power supply voltage generating circuits to be activated can be adjusted according to the number of operating internal circuits, and internal power supply voltage can be supplied stably.

In accordance with the above mentioned further aspect of the present invention, since the second driving voltage applied to a control electrode node of the second drive transistor is produced using external power supply voltage, the second drive transistor is not affected by reduction in internal power supply voltage and can operate with large current driving capability, resulting in high speed input/output of data.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a graph showing the relationship between internal high voltage and internal power supply generated by the internal voltage generating circuit shown in FIG. 3 and external power supply voltage.

FIG. 5 is a signal waveform chart illustrating operation of the internal voltage generating circuit shown in FIG. 3.

DESCRIPTION OF THE PREFERRED EMBODIMENTS

First Embodiment

Figure 1:
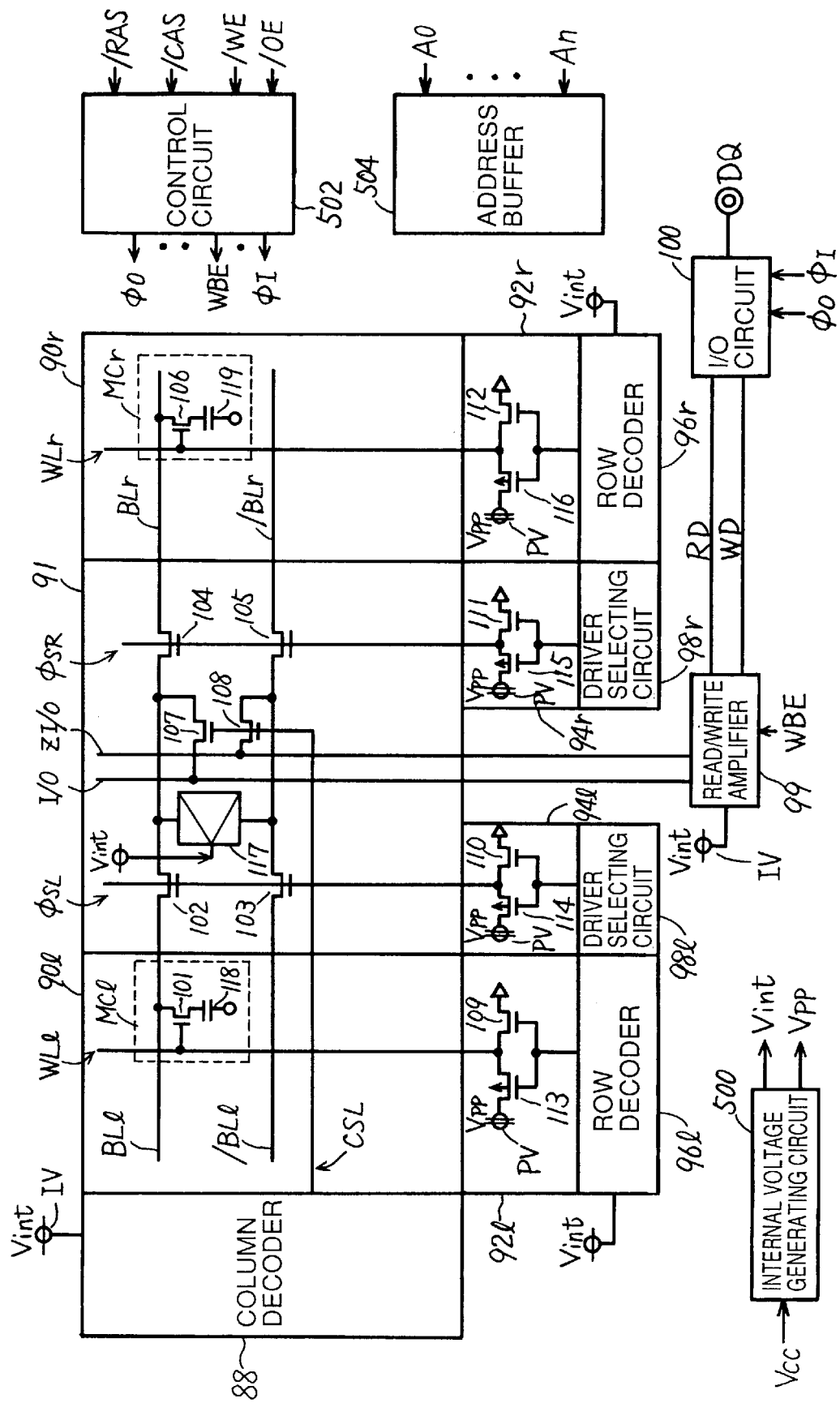
FIG. 1 is a schematic diagram showing the entire structure of a semiconductor memory device in accordance with a first embodiment of the present invention.

FIG. 1 is a schematic diagram showing the entire structure of a semiconductor memory device in accordance with a first embodiment of the present invention. In FIG. 1, the semiconductor memory device includes two memory cell arrays 90*l* and 90*r* each having memory cells MCs arranged in rows and columns, and a sense/IO circuit 91 located between memory cell arrays 90*l* and 90*r*. Each of memory cell arrays 90*l* and 90*r* includes a plurality of word lines WLs located corresponding to memory cell rows and to which memory cells of the corresponding rows are connected, and a plurality of bit line pairs BLs and /BLs located corresponding to memory cell columns and to which memory cells of the corresponding columns are connected. In FIG. 1, a word line WL1 and a bit line pair BL1 and /BL1 are representatively shown in memory cell array 90*l*, and a word line WLr and a bit line pair BLr and /BLr are representatively shown in memory cell array 90r.

Sense/IO circuit 91 includes a sense amplifier 117 provided corresponding to each column of memory cell arrays 90l and 90r. Sense amplifier 117 is shared by bit line pairs located in corresponding columns (the same column) of memory cell arrays 90l and 90r. Sense/IO circuit 91 further includes block select gates 102 and 103 provided corresponding to the bit line pair BLl and /BLl of memory cell array 90l for conducting in response to a block selection signal φSL and respectively connecting the bit line pair BLl and /BLl to sense amplifier 117; block select gates 104 and 105 provided corresponding to the bit line pair BLr and /BLr for conducting in response to a block selection signal φSR and respectively connecting the bit line pair BLr and /BLr to sense amplifier 117; and column select gates 107 and 108 for conducting in response to a column selection signal CSL and respectively connecting sensing nodes (a selected bit line pair) of sense amplifier 117 to an I/O data line pair I/O and ZI/O. The block select gate and the column select gate are located corresponding to each column of memory cell arrays 90l and 90r.

In memory cell arrays 90l and 90r, memory cells are located corresponding to respective intersections of bit line pairs and word lines. A memory cell MCL is shown being located at the intersection of bit line BLl and word line WLl in memory cell array 90l, and a memory cell MCr is shown being located corresponding to the intersection of bit line BLr and word line WLr in memory cell array 90r. Memory cell MCl includes a capacitor 118 for storing information, and an access transistor 101 constituted by an n channel MOS transistor for conducting in response to signal potential on word line WLl and electrically connecting capacitor 118 to bit line BLl. Memory cell MCr includes a capacitor 119 for storing information, and an access transistor 106 for conducting in response to signal potential on word line WLr and electrically connecting capacitor 119 to bit line BLr.

Sense amplifier 117 is shown receiving internal power supply Vint as one operating voltage, which will be described later. This sense amplifier 117 differentially amplifies potentials on a selected bit line pair during operation.

A row decoder 96l for decoding an internal row address signal from an address buffer 504 to output a row selection signal, a word line driver 92l responsive to the row selection signal from row decoder 96l for transmitting internal high voltage Vpp onto a word line located corresponding to a selected row, a driver selecting circuit 98l responsive to a block selection signal from address buffer 504 for outputting an array selection signal for selecting memory cell array 90l, and a block selecting circuit 94 responsive to the array selection signal from driver selection circuit 98l for outputting a block selection signal φSL are provided for memory cell array 90l.

A word line driver 92l includes a word line driving circuit located corresponding to each word line of memory cell array 90l. This word line driving circuit is constituted by a CMOS inverter which operates with internal high voltage Vpp applied to an internal high voltage application node PV and ground voltage as both (one and another) operating power supply voltages. This CMOS inverter includes a p channel MOS transistor 113 and an n channel MOS transistor 109. This word line driving circuit transmits internal high voltage Vpp to a corresponding word line (WLl) when selected (when a row selection signal is at an L level). Block selecting circuit 94 is also constituted by a CMOS inverter which operates with internal high voltage Vpp and ground voltage as both (one and another) operating power supply voltages. This CMOS inverter includes a p channel MOS transistor 114 and an n channel MOS transistor 110. Therefore, a block selection signal φSL varies between the internal high voltage Vpp and the ground voltage. A block selection signal from driver selecting circuit 98l may be constituted controlling activation/deactivation of row decoder 96l.

Furthermore, although internal power supply Vint is shown being transmitted to sense amplifier 117, a sense amplifier activation signal for controlling activation/ deactivation of this sense amplifier 117 is achieved by a sense amplifier driving circuit which is not shown. When this sense amplifier activation signal is activated, the internal power supply Vint is transmitted as one operating power supply voltage to sense amplifier 117, which in turn pulls up potential of a high potential bit line to the internal power supply Vint level.

Memory cell array 90r is also provided with a row decoder 96r, a word line driver 92r, a driver selecting circuit 98r and a block selecting circuit 94r. As in the case of word line driver 92l, word line driver 92r includes a word line driving circuit constituted by a CMOS inverter and located corresponding to each row (that is, word line) of memory cell array 90r. This CMOS inverter is constituted by a p channel MOS transistor 116 and an n channel MOS transistor 112, and operates with internal high voltage Vpp as one operating power supply voltage. As in the case of block selecting circuit 94l, block selecting circuit 94r is also constituted by a CMOS inverter which operates with internal high voltage Vpp as one operating power supply voltage. This CMOS inverter is constituted by a p channel MOS transistor 115 and an n channel MOS transistor 111. Therefore, a block selection signal φSR also varies between the internal high voltage Vpp and the ground voltage.

Each of row decoders 96l and 96r operates with internal power supply Vint as one operating power supply voltage. In addition, each of driver selecting circuits 98l and 98r operates with the internal power supply Vint as one operating power supply voltage. Each output portion of these row decoders 96l and 96r is provided with a feedback circuit which transmits internal high voltage Vpp to an input portion of the word line driving circuit when an output signal of the word line driving circuit is at an L level, and a decoupling transistor (an MOS transistor having its gate receiving internal power supply Vint) located between the input portion of the word line driving circuit and the output portion of the row decoder. Driver selecting circuits 98l and 98r are also provided with a similar structure.

A column selection signal φSL is output from a column decoder 88 provided common to memory cell arrays 90l and 90r. This column decoder 88 operates with internal power supply Vint applied to an internal power supply node IV as one operating power supply voltage.

The semiconductor memory device further includes a read/write amplifier 99 operating with internal power supply Vint as one operating power supply voltage and performing transmission/reception of data between I/O data lines I/O and ZI/O and a read data line RD and a write data line WD, and an I/O circuit 100 for performing input/output of data between the read data line RD and the write data line WD, and the outside of the device.

At the time of writing data, this read/write amplifier 99 is activated in response to a write activation signal WBE and produces complementary internal write data from data on the write data line WD to respectively transmit them to the I/O data lines I/O and ZI/O. In addition, at the time of reading data, read/write amplifier 99 generates read data from complementary internal read data on respective I/O data lines I/O and ZI/O to transmit the read data to read data line RD. Separate provision of read data line RD and write data line WD allows transition from a data read mode to a data write mode and from a data write mode to a data read mode to be achieved at a high speed without being affected by logic of read/write data of the previous cycle.

I/O circuit 100, whose structure will be described later in detail, produces external read data from read data on read data line RD in response to a read instruction signal φO at the time of reading data, and produces internal write data from external write data in response to a write instruction signal φI to transmit the produced data onto write data line WD at the time of writing data.

The semiconductor memory device further includes a control circuit 502 responsive to externally applied control signals, that is, a row address strobe signal /RAS, a column address strobe signal /CAS, a write enable signal /WE and an output enable signal /OE for producing control signals required for each internal operation, and an internal voltage generating circuit 500 for producing internal power supply Vint and internal high voltage Vpp from external power supply voltage Vcc. Although control circuit 502 generates a control signal for determining a timing of latching an address in address buffer 504 and operation of selecting a row and a column in memory cell arrays 90l and 90r, and a control signal for providing a timing of activating a sense amplifier, a read instruction signal φO, a write instruction signal φI and a write activation signal WBE are shown representatively in FIG. 1.

Data read operation of the semiconductor memory device shown in FIG. 1 will now be described briefly with reference to FIG. 2. In the waveform chart shown in FIG. 2, data read operation in the case where a memory cell MCl of memory cell 90l is selected and this memory cell MCl stores data at an H level.

A row address strobe signal /RAS is inactive at an H level before time t1. In this condition, the semiconductor memory device is in a standby state, both block selection signals φSL and φSR are at the internal high voltage Vpp level, and word lines WLl and WLr are in a non-selected state at an L level. Bit lines BLl and /BLl and bit lines BLr and /BLr are connected to each other through block select gates 102 to 105, and are precharged to intermediate potential (Vint/2) by equalizing means which is not shown.

One memory cell cycle is initiated when the row address strobe signal /RAS falls to an L level at the time t1. Address bits A0-An applied at that time are introduced as an X address in response to the fall of the row address strobe signal /RAS. Driver selecting circuit 94l keeps a block selection signal φSL at the internal high voltage Vpp level, in response to a block address signal contained in the introduced X address signal. On the other hand, driver selecting circuit 98r causes the block selection signal φSR to be at an L level of the ground potential level in response to the block address signal, and renders block selection gates 104 and 105 non-conductive. Thus, bit lines BLr and /BLr are separated from sense amplifier 117.

Then, row decoder 96l performs row selecting operation in response to a row address signal contained in the X address signal, and a selected word line WLl is driven to the internal high voltage Vpp level through word line driver 92l. An access transistor 101 of memory cell MCl is rendered conductive in response to the rise of potential of word line WLl, so that capacitor 118 and bit line BLl are electrically connected to each other. Consequently, potential of bit line BLl rises, while bit line /BLl maintains intermediate potential. Since bit lines BLr and /BLr are separated from sense amplifier 117, parasitic capacitance of a bit line connected to the sense amplifier 117 is small, and sufficient read voltage is transmitted to sense amplifier 117 quickly.

Then, sense amplifier 117 is activated (this signal is not shown), and potential of bit line BLl rises to the internal power supply Vint level, while potential of bit line /BLl falls to the ground potential level. The block selection signal φSL is at the internal high voltage Vpp level, and potential of bit line BLl surely rises to the internal power supply Vint level by sense operation of sense amplifier 117 without threshold voltage loss across block selection gates 102 and 103. In addition, word line WLl goes to the internal high voltage Vpp level, and the voltage at the internal power supply Vint level on the bit line BLl is surely transmitted to capacitor 118 without threshold voltage loss across access transistor 101, so that memory cell data is surely restored.

When a column address strobe signal /CAS falls to an L level at time t2, address signals A0-An applied at that time are introduced as a Y address signal and transmitted to column decoder 88. Column decoder 88 is activated, in response to the fall of the column address strobe signal /CAS, under the control of control circuit 502 to perform column selecting operation, thereby rendering a column selection signal CSL at an H level. Thus, column select gates 107 and 108 are rendered conductive and data (signals on bit lines BLl and /BLl) sensed and amplified by sense amplifier 117 are transmitted to data I/O lines I/O and ZI/O, respectively. Complementary internal read data on respective data I/O lines I/O and ZI/O are amplified by read/write amplifier 99, so that internal read data is produced and transmitted onto read data line RD. This read/write amplifier 99 operates with internal power supply Vint as one operating power supply voltage, and the internal read data on read data line RD will be a signal at the internal power supply Vint level. Then, if a data output instruction signal φO from control circuit 502 is rendered active, an output circuit portion which has been in an output high impedance (Hi-Z) state is activated and buffers the internal read data on read data line RD to produce data at the external power supply voltage Vcc level for outputting.

At the time of writing data, I/O circuit 100 is activated in response to data write instruction signal φI and transmits internal write data onto write data line WD. Then, read/write amplifier 99 is activated in response to a write activation signal WBE, and transmits the internal write data to I/O data lines I/O and ZI/O. The internal write data transmitted to I/O data lines I/O and ZI/O are written to selected memory cell MCl.

As described above, in the portion where a data signal is transmitted through a MOS transistor, a signal at the internal power supply Vint level is transmitted without threshold voltage loss across the MOS transistor by causing the voltage level of signal (a word line selection signal and a block selection signal) applied to the gate of the MOS transistor to be at the internal high voltage Vpp level, so that data can be surely read/written.

Figure 3:
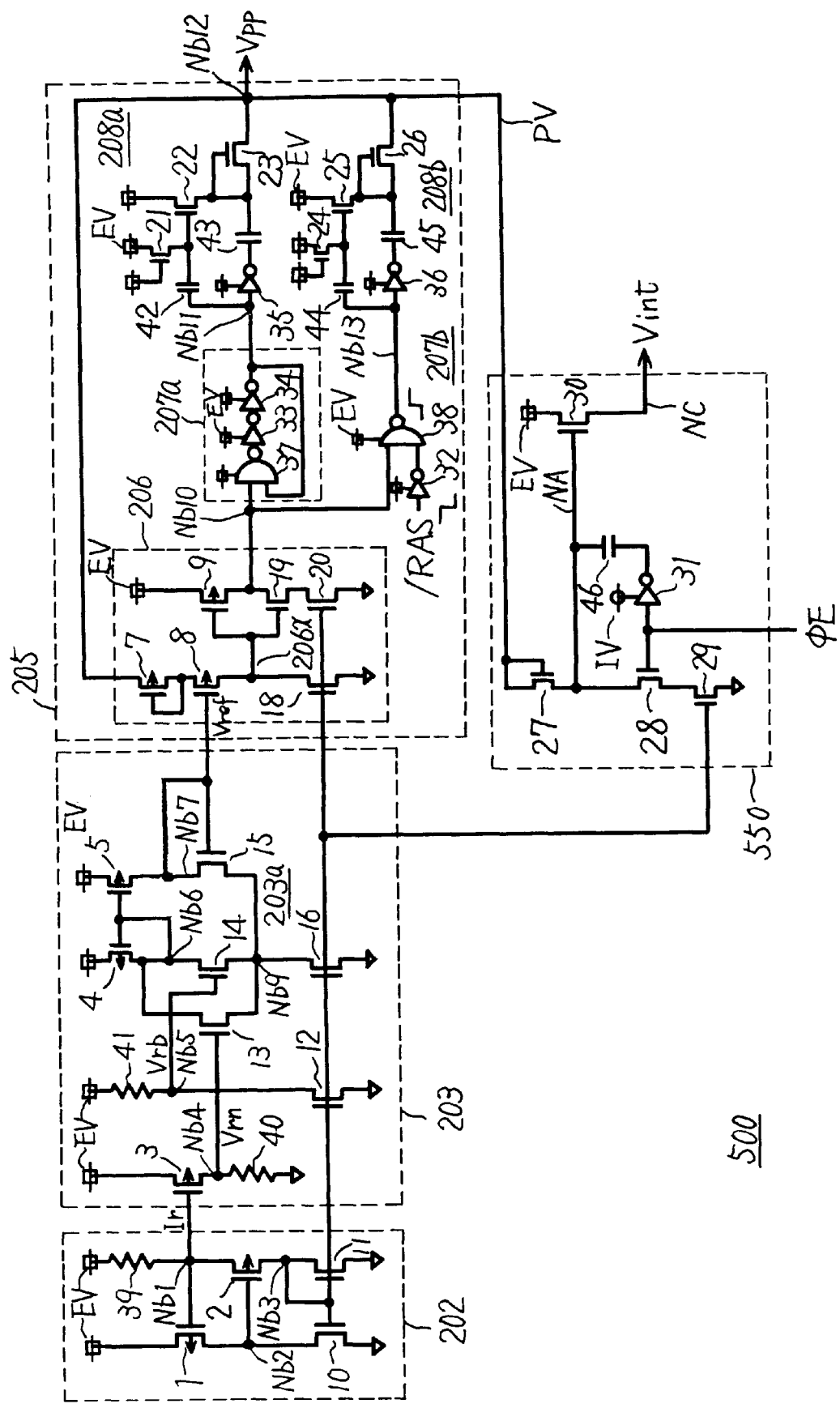
FIG. 3 is a diagram showing a structure of an internal voltage generating circuit shown in FIG. 1.

FIG. 3 is a diagram showing an example of a structure of internal voltage generating circuit 500 shown in FIG. 1. In FIG. 3, internal voltage generating circuit 500 includes a constant current source 202 coupled to an external power supply node EV and operating with external power supply voltage EV as one operating power supply voltage for producing a constant reference current Ir, a reference potential generating circuit 203 for converting constant current Ir from constant current source 202 into a voltage signal and producing a reference potential Vref, an internal high voltage generating circuit 205 operating with external power supply voltage Vcc applied to the external power supply node EV as one operating power supply voltage for producing internal high voltage Vpp whose voltage level is defined by the reference potential Vref, and an internal power supply generating circuit 210 for producing internal power supply Vint from the internal high voltage Vpp.

The internal high voltage Vpp produced in internal high voltage generating circuit 205 is applied to word line drivers 92*l* and 92*r* and block selecting circuits 94*l* and 94*r* shown in FIG. 1. Internal power supply generating circuit 210 generates internal power supply Vint, utilizing the internal high voltage Vpp used for word line selection or the like. Accordingly, an internal high voltage generating circuit dedicated to production of internal power supply Vint is not necessary, resulting in reduction in both power consumption and area occupied by circuits.

Constant current source 202 includes a resistance element 39 connected between a power supply node EV and a node Nb1; a p channel MOS transistor 1 connected between power supply node EV and a node Nb2 and having its gate connected to node Nb1; a p channel MOS transistor 2 connected between node Nb1 and a node Nb3 and having its gate connected to node Nb2; an n channel MOS transistor 10 connected between node Nb2 and a ground node and having its gate connected to node Nb3; and an n channel MOS transistor 11 connected between node Nb3 and the ground node and having its gate connected to node Nb3.

MOS transistors 10 and 11 constitute a current mirror circuit, and cause current flows of the same magnitude. MOS transistor 1 is made to have relatively large current driving capability. If a resistance value of resistance element 39 is made sufficiently large, current flowing from power supply node EV through resistance element 39 and MOS transistors 2 and 11 into the ground node can be made sufficiently small. Current flowing through MOS transistor 1 is also made sufficiently small by the effect of the current mirror circuit constituted by MOS transistors 10 and 11. In this condition, gate-source voltage of MOS transistor 1 is equivalent to a threshold voltage Vthp of MOS transistor 1.

If current flowing through MOS transistor 1 is increased, potential of node Nb2 rises and conductance of MOS transistor 2 decreases, so that current flowing through resistance element 39 is reduced and potential of node Nb1 rises accordingly. Thus, current flowing through MOS transistor 1 is reduced. On the contrary, if current flowing through MOS transistor 1 is reduced, potential of node Nb2 falls and conductance of MOS transistor 2 increases, so that current flowing through resistance element 39 is increased and potential of node Nb1 falls accordingly. Consequently, conductance of MOS transistor 1 is increased, and current flowing through MOS transistor 1 is also increased.

Current flowing through resistance element 39 is constantly made equal to that flowing through MOS transistor 1 by the feedback control of MOS transistor 2. In this condition, if a resistance value of resistance element 39 is represented by R1, the amount of current flowing through resistance element 39 has a constant value of |Vtp|/R1 regardless of the value of power supply voltage Vcc applied to power supply node EV.

Reference potential generating circuit 203 generates fixed reference potential Vref, using constant current Ir supplied from constant current source 202. Reference potential generating circuit 203 includes a p channel MOS transistor 3 connected between power supply node EV and a node Nb4 and having its gate connected to output node Nb1 of constant current source 202; a resistance element 40 connected between node Nb4 and the ground node; a resistance element 41 connected between power supply node EV and a node Nb5; an n channel MOS transistor 12 connected between node Nb5 and the ground node and having its gate connected to node Nb3; and a differential amplifying stage 203*a* for comparing respective potentials on nodes Nb4 and Nb5 to reference potential Vref.

Differential amplifying stage 203*a* includes a p channel MOS transistor 4 connected between power supply node EV and a node Nb6 and having its gate connected to a node Nb6; a p channel MOS transistor 5 connected between power supply node EV and node Nb7 and having its gate connected to node Nb6; an n channel MOS transistor 13 connected between node Nb6 and a node Nb9 and having its gate connected to node Nb4; an n channel MOS transistor 14 connected between node Nb6 and node Nb9 and having its gate connected to node Nb5; an n channel MOS transistor 15 connected between node Nb7 and node Nb9 and having its gate connected to node Nb7; and an n channel MOS transistor 16 connected between node Nb9 and the ground node and having its gate connected to node Nb3.

Each of MOS transistors 12 and 16 constitutes a current mirror circuit together with MOS transistor 11 in constant current source 202 and functions as a current source for producing small current flow. Operation of reference potential generating circuit 203 will now be described.

MOS transistor 3 constitutes, together with MOS transistor 1 in constant current source 202, a current mirror circuit. If the mirror ratio of MOS transistors 1 and 3 is represented by m, current flowing through MOS transistor 3 is m•Ir. If a resistance value of resistance element 40 is represented by R2, potential of node Nb4 is m•Ir•R2 with reference to the ground potential. Potential Vrn on node Nb4 is set to about 2 V by selecting the mirror ratio m and the resistance value R2 appropriately. In addition, if the mirror ratio of MOS transistors 11 and 12 is represented by n, current flowing through MOS transistor 12 is n•Ir. If a resistance value of a resistance element 41 is represented by R3, potential Vrb on node Nb5 is Vcc-n•Ir•R3. Potential Vrb on node Nb5 is set to Vcc-1 or to about 2 V by selecting the mirror ratio n and the resistance value R3 appropriately. As can be seen from the above expressions, potential Vrn on node Nb4 has a constant value regardless of power supply voltage Vcc, and potential Vrb on node Nb5 varies depending on power supply voltage Vcc.

In differential amplifying stage 203*a*, MOS transistors 4 and 5 constitute a current mirror circuit, and higher potential out of potentials Vrn and Vrb is compared to reference potential Vref. If the reference potential Vref is higher than both potentials Vrn and Vrb, large current flows through MOS transistor 15, and potential on node Nb7 lowers due to mirror current of current mirror circuit of MOS transistors 4 and 5, whereby conductance of MOS transistor 15 is decreased, and current flowing from power supply node EV through MOS transistor 15 is reduced resulting in decrease of reference potential Vref.

If the reference potential Vref is lower than at least one of potentials Vrn and Vrb, MOS transistor 13 or 14 discharges current larger than current flowing in MOS transistor 15. Accordingly, potential of node Nb7 rises due to the mirror current and conductance of MOS transistor 15 is increased, and the mirror current flows through MOS transistor 15 and is converted into the reference potential Vref, resulting in increase in reference potential Vref. Thus, reference potential Vref having such a characteristic as shown in FIG. 4 is output from reference potential generating circuit 203.

In FIG. 4, the abscissa indicates voltage (V) of power supply voltage Vcc, and the ordinate indicates each voltage V. Internal high voltage Vpp and internal power supply Vint are also shown in FIG. 4. If power supply voltage Vcc is low, potential of node Nb1 is low (resistance element 39 is a high resistance element), current flowing through MOS transistor 1 increases with power supply voltage Vcc, and potential Vrn on node Nb4 also increases with increase in power supply voltage Vcc accordingly. If power supply voltage Vcc is |Vthp|+Vthn or more, MOS transistor 11 is rendered conductive and gate potential of MOS transistor 1 is kept to Vcc−|Vthp|, so that constant current Ir is supplied and potential Vrn on node Nb4 is fixed.

On the other hand, even if power supply voltage Vcc is applied, potential Vrb on node Nb5 does not rise immediately, and MOS transistor 12 discharges current, so that potential Vrb on node Nb5 approximately maintains the ground voltage level for a while. If power supply voltage Vcc is n•Ir•R3 or more and current Ir has a constant value, potential Vrb on node Nb5 rises with increase in power supply voltage Vcc. Since differential amplifying stage 203a compares higher potential out of potentials Vrb and Vrn to reference potential Vref, the reference potential Vref varies with the higher potential out of potentials Vrb and Vrn. It is for the purpose of performing an acceleration test such as a burn-in test to increase the reference potential Vref with the power supply voltage Vcc when the power supply voltage Vcc has a prescribed value (4 V in FIG. 4) or more.

Figure 2:
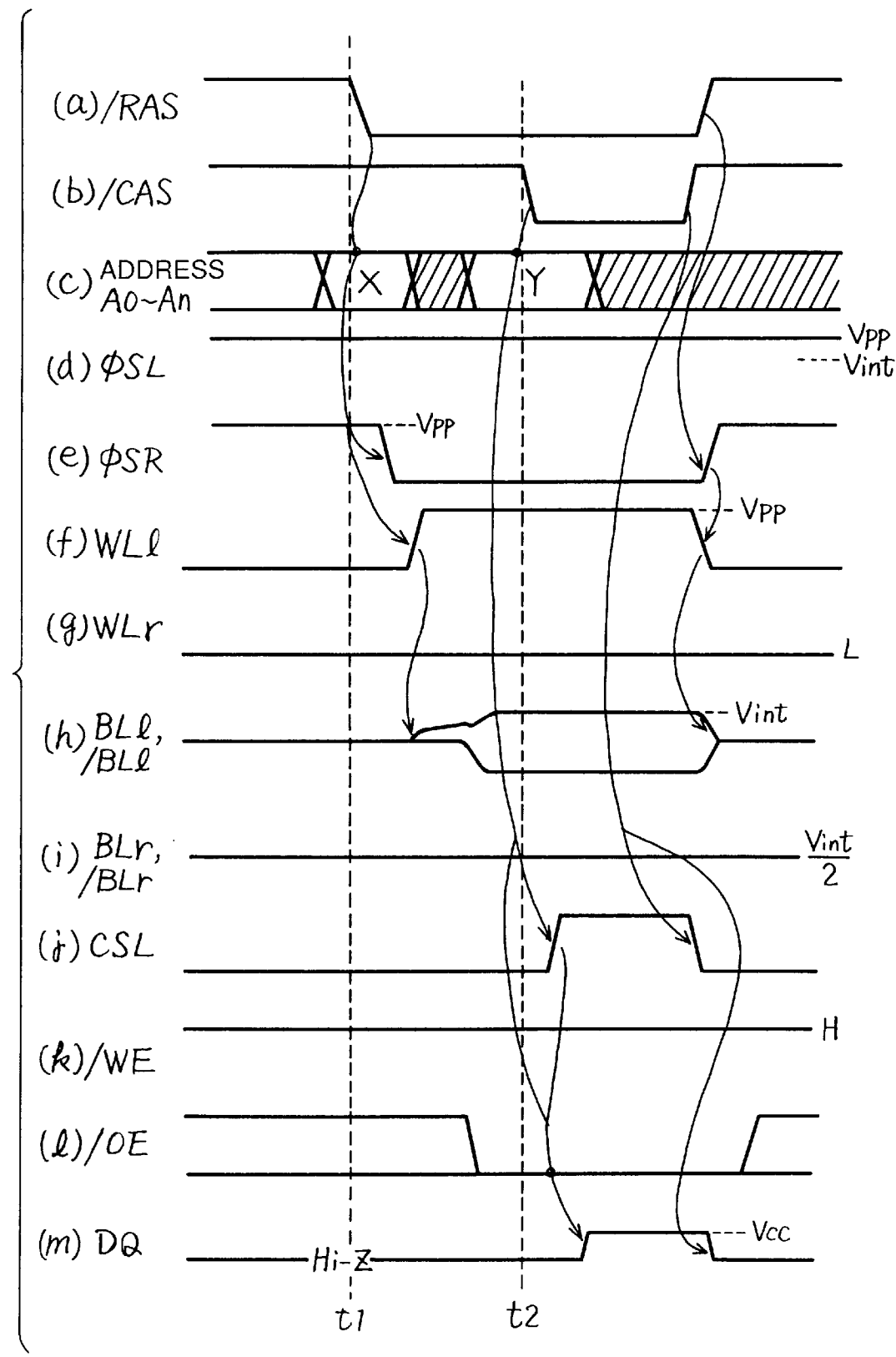
FIG. 2 is a signal waveform chart illustrating operation of the semiconductor memory device shown in FIG. 1.

It is noted that internal power supply Vint2 is shown in FIG. 2. This internal power supply Vint2 is voltage applied to an output circuit portion which will be described later, and is used to read data at a high speed.

Referring back to FIG. 3, internal high voltage generating circuit 205 includes a level detecting circuit 206 for detecting whether internal high voltage Vpp is at least at a prescribed level or not; an oscillating circuit 207a which is activated in response to an output signal of level detecting circuit 206; a charge pumping circuit 208a responsive to a clock signal output from oscillating circuit 207a for performing charge pumping operation to supply charges to a node Nb12; a clock generating circuit 207b responsive to activation of a row address strobe signal /RAS for generating a clock; and a charge pumping circuit 208b responsive to an output signal of clock generating circuit 207b for supplying charges to node Nb12 through charge pumping operation.

Level detecting circuit 206 includes a diode-connected p channel MOS transistor 7 for receiving internal high voltage Vpp on node Nb12; a p channel MOS transistor 8 connected between MOS transistor 7 and a node 206x and having its gate receiving reference potential Vref; a p channel MOS transistor 9 connected between power supply node EV and a node Nb10 and having its gate connected to node 206x; an n channel MOS transistor 18 connected between node 206x and the ground node and having its gate connected to node Nb3; and n channel MOS transistors 19 and 20 connected in series between node Nb10 and the ground node. MOS transistor 19 has its gate connected to node 206x. Each of MOS transistors 18 and 20 constitutes a current mirror circuit together with MOS transistor 11, and functions as a current source.

Oscillating circuit 207a includes an NAND circuit 37 having its one input connected to ntwo stages of inverded two stages of inverters 33 and 34 for receiving an output signal of NAND circuit 37. An output signal of inverter 34 is fed back to the other input of NAND circuit 37. When potential on node Nb10 is at an H level (a power supply voltage Vcc level), NAND circuit 37 functions as an inverter, and oscillating circuit 207a operates as a ring oscillator constituted by three stages of inverters and outputs a clock signal having a prescribed period and an amplitude of power supply voltage Vcc. When potential on node Nb10 is at an L level (a ground voltage level), an output of NAND circuit 37 is fixed to an H level, and oscillating operation thereof is stopped.

Charge pumping circuit 208a includes an inverter 35 for receiving a clock signal applied from oscillator circuit 207a to node Nb11; a charge pueping capacitor 43 responsive to an output signal of inverter 35 for performing charge pumping operation; a diode-connected n channel MOS transistor 23 for transmitting charges supplied froma capacitor 43 to node Nb12; an n channel MOS transistor 22 connected between power supply node EV and the gate and the drain of MOS transistor 23; a diode-connected n channel MOS transistor 21 connected between power suppl y node EV and the gate of MOS transistor 22; and a charge pumping capacitor 42 responsive to a signal potential on node Nb11 for supplying charges to the gate of MOS transistor 22.

MOS transistor 21 clamps the gate pote ntial of MOS transistor 22 to Vcc−Vthn. MOS transistor 22 precharges the gate potential and drain potential of MOS transistor 23 to the Vcc level. Clock generating circuit 207b includes an inverter 32 for receiving the row address strobe signal /RAS, and an NAND circuit 38 for receiving a signal on node Nb10 and an output signal of inverter 32.

Charge pumping circuit 208b has a structure similar to that of charge pumping circuit 208a, and includes an inverter 36 for receiving potential on a node Nb13; a capacitor 45 responsive to an output signal of inverter 36 for performing charge pumping operation; a diode-connected n channel MOS transistor 26 for transmitting charges supplied from capacitor 45 to node Nb12; a capacitor 44 responsive to potential on node Nb13 for performing charge pumping operating; an n channel MOS transistor 25 connected between power supply node EV and the gate and the drain of MOS transistor 26 and having its gate receiving charges from capacitor 44; and a diode-connected n channel MOS transistor 24 connected between power supply node EV and the gate of MOS transistor 25. Operation of internal high voltage generating circuit 205 will now be described.

In level detecting circuit 206, MOS transistor 18 supplies a small current. MOS transistor 8 is rendered conductive if the source-gate voltage thereof is at least an absolute value of threshold voltage Vthp. MOS transistor 7 operates in a diode mode due to a current limiting function of MOS transistor 18, and reduces internal high voltage Vpp on node Nb12 by an absolute value of threshold voltage thereof to transmit the resultant voltage. Accordingly, if potential on node Nb12, that is, internal high voltage Vpp is Vref+2 |vthp| or more, both MOS transistors 7 and 8 are rendered conductive and potential of node 206x attains an H level. MOS transistors 9, 19 and 20, as a whole, operate as an inverter, and inverts an H level (voltage at the reference potential Vref level or more) applied onto node 206x to transmit a signal at the ground voltage level to node Nb10. In this condition, respective output signals of NAND circuits 37 and 38 are fixed to an H level, and charge pumping operation of charge pumping circuits 208a and 208b is stopped.

On the other hand, if internal high voltage Vpp is lower than Vref+2 |vthp|, at least one of MOS transistors 7 and 8 is off, and node 206x is discharged by MOS transistor 18 to be at an L level. Thus, potential on node Nb10 attains an H level of the power supply voltage Vcc level, and each of NAND circuits 37 and 38 functions as an inverter. Oscillating circuit 207a performs oscillating operation, and potential on node Nb11 varies between power supply voltage Vcc and ground potential according to an output signal of oscillating circuit 207a. If potential on node Nb11 rises, potential of MOS transistor 22 rises to 2•Vcc−Vth level, and MOS transistor 22 supplies power supply voltage Vcc to the gate and the drain of MOS transistor 23.

If potential on node Nb11 falls to an L level, gate potential of MOS transistor 22 is clamped to Vcc−Vthn by MOS transistor 21, and MOS transistor 22 is turned off. On the other hand, an output signal of inverter 35 attains an H level, voltage of the gate and the drain of MOS transistor 23 rises to 2•Vcc level by charge pumping operation of capacitor 43, and charges are supplied to node Nb12. Thus, a potential level of internal high voltage Vpp is increased.

In a standby cycle, row address strobe signal /RAS is at an H level and an output signal of NAND circuit 38 is rendered to be at an H level. Accordingly, an output signal of inverter 36 is at an L level, and the gate and the drain of MOS transistor 26 are precharged to the power supply voltage Vcc level through MOS transistor 25. Since MOS transistor 26 is rendered conductive only when Vcc−Vpp >Vthn, MOS transistor 26 is kept in a non-conductive state in this condition. If the row address strobe signal /RAS is rendered to be at an L level, an output signal of NAND circuit 38 falls to an L level and an output signal of inverter 36 accordingly rises to an H level. Potential of the gate and the drain of MOS transistor 26 responsively rises to 2•Vcc level by charge pumping operation of capacitor 45, and MOS transistor 26 supplies charges to node Nb12.

Charge pumping circuit 208a which operates at all times is made to have relatively small charge supplying capability in order to reduce power consumption. When the row address strobe signal /RAS is pulled at an L level and internal circuitry operates, the internal high voltage Vpp is consumed. Charge pumping circuit 208b having relatively large charge supplying capability is rendered operative in order to compensate for potential fall caused by consumption of internal high voltage Vpp. In other words, this charge pumping circuit 208b performs charge pumping operation using the row address strobe signal /RAS as a clock signal. Thus, potential fall of the internal high voltage Vpp during operation of the internal circuitry is suppressed.

Accordingly, the voltage level of internal high voltage Vpp is held at the voltage level of Vref+2 |vthp| by the function of level detecting circuit 206.

Internal power supply generating circuit 550 includes a diode-connected n channel MOS transistor 27 connected between a node NA and an internal high voltage application node PV coupled to internal high voltage output node Nb12; n channel MOS transistors 28 and 29 connected in series between node NA and a ground node; an n channel MOS transistor 30 connected between power supply node EV and an internal power supply output node NC and having its gate connected to node NA; an inverter 31 for receiving an internal circuitry operation instruction signal φE; and a charge pumping capacitor 46 responsive to an output signal of inverter 31 for performing charge pumping operation and supplying charges to node NA. Inverter 31 operates with internal power supply Vint applied to internal power supply node IV as one operating power supply voltage. This internal circuitry operation instruction signal φE is also applied to the gate of MOS transistor 28.

MOS transistor 29 has its gate connected to node Nb3 of constant current source 202, constitutes a current mirror circuit together with MOS transistor 11, and functions as a current source for supplying small current. Constant current source transistor 29 for supplying small current causes MOS transistor 27 to operate in a diode mode, and MOS transistor 27 reduces internal high voltage Vpp supplied onto internal high voltage supply node PV by threshold voltage Vthn thereof and transmits the resultant voltage to node NA. MOS transistor 30 operates in a source follower mode, and supplies internal power supply Vint at the level of Vpp−Vthn (27)−Vthn(30) to internal power supply node NC. Vthn(27) and Vthn(30) indicate threshold voltages of MOS transistors 27 and 30, respectively, wherein Vcc>Vpp−Vthn (the relationship of Vcc−Vthn>Vpp is satisfied in the internal high voltage generating circuit (MOS transistors 23 and 26 would not be turned off otherwise)).

Assuming that threshold voltages Vthn of all the n channel MOS transistors and absolute values of threshold voltages Vthp of all the p channel MOS transistors are now approximately the same, Vint=Vpp−2•Vthn=Vref. Accordingly, internal power supply Vint at a voltage level equal to that of reference potential Vref can be output.

Since quick response is not required for differential comparison stage 203a in reference potential generating circuit 203 (reference potential Vref is only applied to the gate of MOS transistor 8 in level detecting circuit 206 of the internal high voltage generating circuit), current consumption in the inside thereof can be made sufficiently small. In addition, internal power supply generating circuit 550 is needed to keep potential on node NA at a constant voltage level. MOS transistor 28 has a function to sink small current from MOS transistor 27 to prevent the node NA from being in an electrically floating state and potential on node NA from rising (charge-up). Accordingly, only small current flowing through MOS transistor 29 is consumed and current consumption of internal power supply generating circuit 550 is extremely small, so that internal power supply Vint can be generated stably with low current consumption.

If internal circuitry which consumes the internal power supply Vint operates rapidly with large current consumption, the internal power supply Vint falls quickly. In this case, since large current flows through MOS transistor 30 into internal power supply node NC, the potential level of the internal power supply Vint might be reduced to a level lower than a desired potential level due to channel resistance of MOS transistor 30. Therefore, when the internal circuitry operates, potential of internal node NA is increased by charge pumping capacitor 46 and conductance of MOS transistor 30 is made sufficiently large so as to reduce the channel resistance thereof. Thus, the internal power supply Vint is prevented from being reduced to a level lower than that required (the reference potential Vref level). This operation will now be described with reference to FIG. 5.

Since the internal circuitry does not operate with an internal circuitry operation instruction signal φE being at an H level (the internal power supply Vint level), the internal power supply Vint is not consumed or an extremely small amount of the internal power supply Vint (such as leak current) is consumed. In this condition, MOS transistor 28 is on, an output signal of inverter 31 is at an L level, and node NA is clamped to a prescribed potential level by MOS transistor 27.

When the internal circuitry operates, the internal circuitry operation instruction signal φE is rendered to be at an L level for a prescribed period and MOS transistor 28 is made turned off. The output signal of inverter 31 rises to an H level in response to the fall of the signal φE, and potential on node NA rises due to charge pumping operation of charge pumping capacitor 46. If the potential on internal node NA rises, MOS transistor 27 is turned off, and therefore, a charge outflow path does not exist, and as a result, potential on node NA rises surely. Due to the rise of the potential on node NA, conductance of MOS transistor 30 is increased, and channel resistance thereof is reduced. Thus, large current is supplied from power supply node EV to internal power supply node NC with little voltage drop, and reduction in the internal power supply Vint shown by a broken line in FIG. 5 is compensated for quickly, so that the internal power supply Vint can be kept stably at a constant voltage level. A desired effect can be obtained if the potential on node NA rises by about 0.1 V. Furthermore, current of about 0.05 µA flowing through MOS transistor 29 would be sufficient. In this manner, current consumption of internal power supply generating circuit 550 can be reduced sufficiently. Although respective threshold voltages of MOS transistors 27 and 30 are shown being equal to each other in the above description, these threshold voltages may be different from each other.

Figure 6:
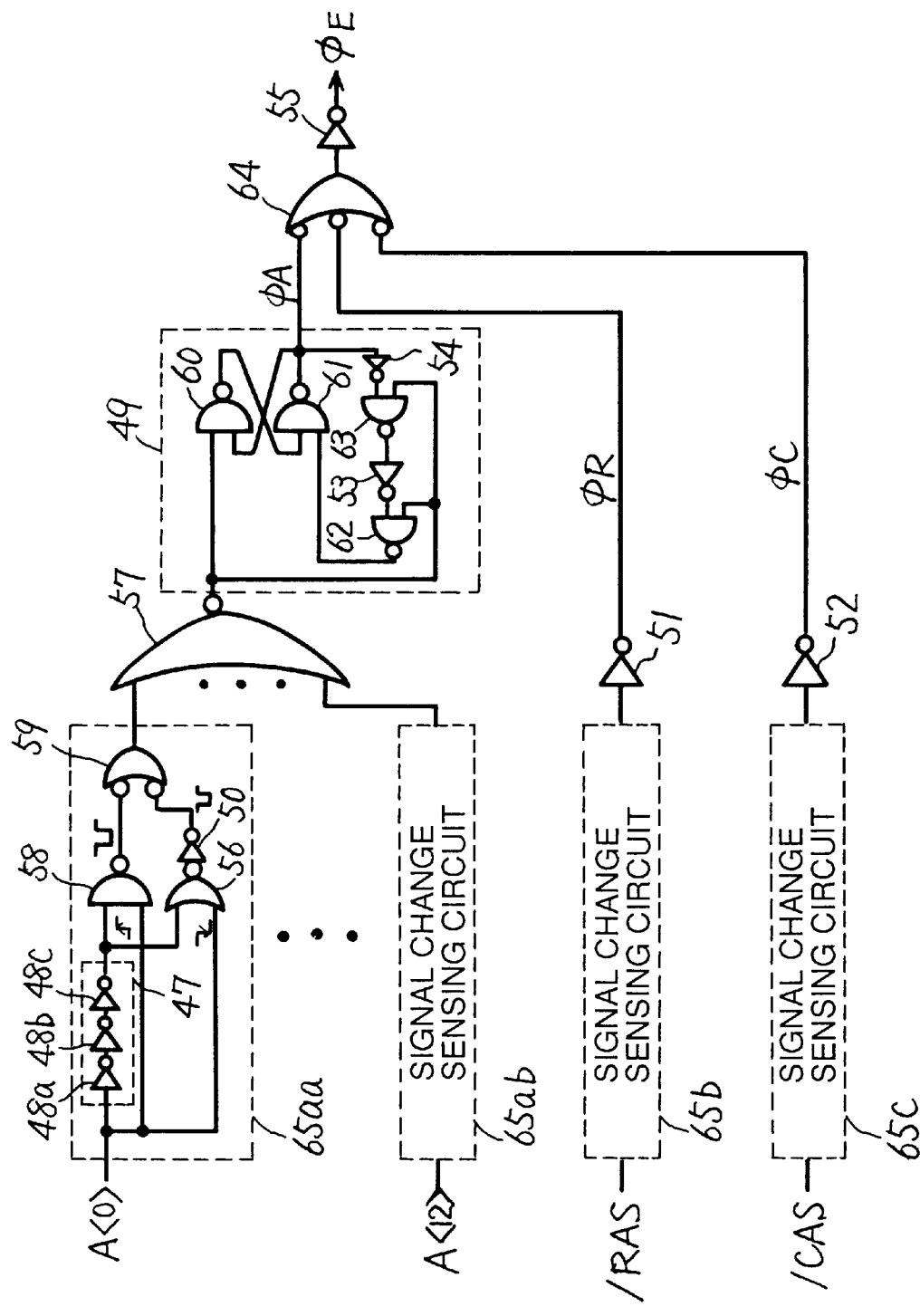
FIG. 6 is a diagram showing a structure of a circuit for generating an internal circuitry operation instruction signal shown in FIG. 3.

FIG. 6 is a diagram showing a structure of a circuit for generating an internal circuitry operation instruction signal φE. In FIG. 6, the internal circuitry operation instruction signal generating circuit includes signal change sensing circuits 65aa–65ab for detecting transitions in address signal bits A <0>-A <12>, respectively; a signal change sensing circuit 65b for detecting transition in row address strobe signal /RAS; a signal change sensing circuit 65c for detecting transition in column address strobe signal /CAS; an NOR circuit 57 for receiving respective output signals of signal change sensing circuits 65aa–65ab for the address signal bits; a pulse generating circuit 49 responsive to an output signal of NOR circuit 57 for generating a one-shot pulse; inverter circuits 51 and 52 for inverting output signals of signal change sensing circuits 65b and 65c, respectively; an NAND circuit 64 for receiving respective output signals φA, φR and φC of pulse generating circuit 49 and inverter circuits 51 and 52; and an inverter 55 for receiving an output signal of NAND circuit 64. An internal circuitry operation instruction signal φE is output from inverter circuit 55.

Signal change sensing circuits 65aa–65ab, 65b and 65c have substantially the same structure. Only the structure of signal change sensing circuit 65aa is shown representatively in FIG. 6. Signal change sensing circuit 65aa includes an inversion and delay circuit 47 for inverting and delaying an address signal bit A <0>, an NAND circuit 58 for receiving an address signal bit A <0> and an output signal of inversion and delay circuit 47, an NOR circuit 56 for receiving an output signal of inversion and delay circuit 47 and an address signal bit A <0>, an inverter 50 for receiving an output signal of NOR circuit 56, and an NAND circuit 59 for receiving an output signal of NAND circuit 58 and an output signal of inverter 50.

Inversion and delay circuit 47 and NAND circuit 58 output a pulse signal (at an L level) having a pulse width equal to a delay time of inversion and delay circuit 47, in response to rise of the address signal bit A <0>. On the other hand, NOR circuit 56 and inverter 50 output a pulse signal (at an L level) having a pulse width equal to a delay time of inversion and delay circuit 47, in response to fall of the address signal bit A <0>. NAND circuit 59 outputs a signal at an H level when one of the respective output signals of NAND circuit 58 and inverter 50 is at an L level. Therefore, signal change sensing circuit 65aa outputs a signal at an H level in response to the change transition in the address signal bit A <0>. NOR circuit 57 receives respective output signals of signal change sensing circuits 65aa–65ab, and outputs a signal at an L level when at least one of the received signals is at an H level. Accordingly, a signal at an L level is output from NOR circuit 57 according to the change in address signal bits A <0>-A <12>.

Pulse generating circuit 49 includes NAND circuits 60 and 61 constituting a flipflop which is set by an output signal of NOR circuit 57; an inverter 54 for receiving an output signal of NAND circuit 61; an NAND circuit 63 for receiving an output signal of inverter 54 and an output signal of NOR circuit 57; an inverter 53 for receiving an output signal of NAND circuit 63; and an NAND circuit 62 for receiving an output signal of inverter 53 and an output signal of NOR circuit 57. NAND circuit 60 has its one input receiving an output signal of NOR circuit 57, and the other input receiving an output signal of NAND circuit 61. NAND circuit 61 has its one input receiving an output signal of NAND circuit 60, and the other input receiving an output signal of NAND circuit 62. NAND circuits 62 and 63 and inverters 54 and 53 constitute a delay circuit. The operation of pulse generating circuit 49 will now be described.

When an output signal of NOR circuit 57 is at an H level, NAND circuits 60 and 62 merely function as inverters, and a state of an output signal φA does not change. When the output signal of NOR circuit 57 falls to an L level, an output signal of NAND circuit 60 rises to an H level. At this time, an output signal of NAND circuit 62 also attains an H level, and the signal φA from NAND circuit 61 falls to an L level. When the signal φA is at an L level, an output signal of inverter 54 attains an H level. NAND circuit 63 receives a signal at an L level from NOR circuit 57, and outputs a signal at an H level regardless of change in the output signal of inverter 54. Then, if the output signal of NOR circuit 57 attains an H level, NAND circuits 62 and 63 function as inverters. In this condition, since inverter 54 outputs a signal at an H level, an output signal of NAND circuit 63 is pulled at an L level, an output signal of inverter 53 is at an H level, and an output signal of NAND circuit 62 is accordingly at an L level. As a result, the signal φA attains an H level through NAND circuit 61. More specifically, pulse generating circuit 49 is set if an output signal of NOR circuit 57 falls to an L level, and is reset after the lapse of delay time of NAND circuits 62 and 63 and inverter 53 if the output signal of NOR circuit 57 returns to H level. Accordingly, the signal φA is kept at an L level for a prescribed time period after the changing time when the address signal bits A <0>-A <2> changed. Although the number of address signal bits is shown being 13 by way of example in FIG. 6, the number of address signal bits is changed depending on the storage capacity of a semiconductor memory device.

Since each of signal change sensing circuits 65b and 65c for row address strobe signal /RAS and column address strobe signal /CAS, respectively, has a structure similar to that described above, signals φR and φC from inverters 51 and 52 are kept at an L level for a prescribed time period after the changing time of the row address strobe signal /RAS and the column address strobe signal /CAS, respectively. Delay times of delay circuits (47) in signal change sensing circuit 65b for row address strobe signal /RAS and signal change sensing circuit 65c for column address strobe signal /CAS are set appropriately according to operation periods of an RAS related circuitry and CAS related circuitry, respectively. The operation of the internal circuitry operation instruction signal generating circuit shown in FIG. 6 will now be described with reference to FIGS. 7 and 8.

Figure 7:
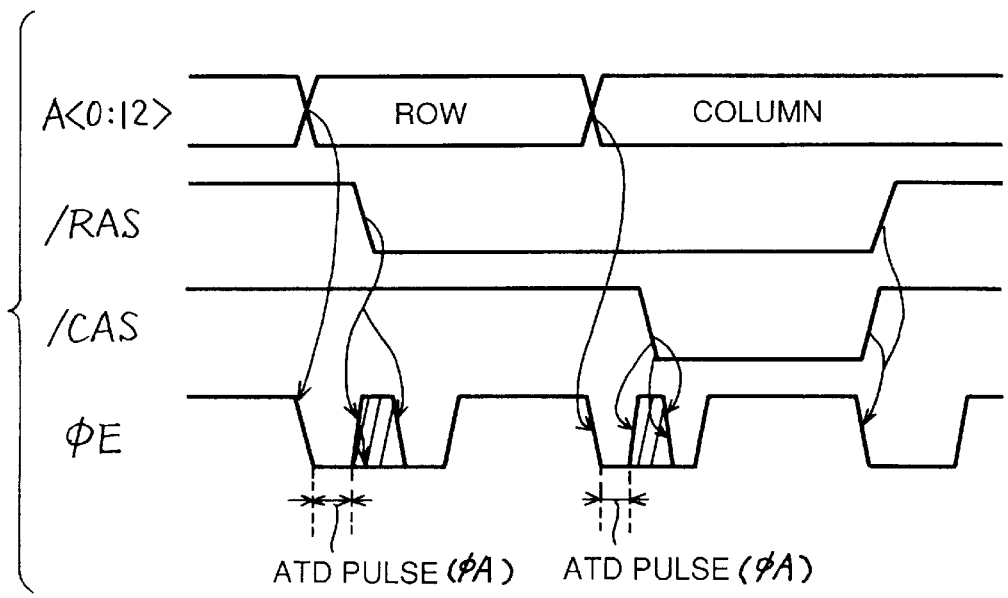
FIG. 7 is a signal waveform chart illustrating operation of the internal circuitry operation instruction signal generating circuit shown in FIG. 6.

As shown in FIG. 7, if an address signal bits A <0:12> change, an internal circuitry operation instruction signal φE falls to an L level. A row address buffer operates and internal power supply Vint is consumed at this changing time of the address signal bits A <0:12>. Then, row address strobe signal /RAS falls to an L level. A signal φR shown in FIG. 6 falls to an L level in response to the fall of the row address strobe signal /RAS, and a signal φE responsively falls to an L level. This row address strobe signal /RAS occurs after the lapse of an address set-up time from the changing time of the address signal bits A <0:12>. The period (shown as an ATD pulse) during which a signal φA output from pulse generating circuit 49 is at an L level may be made longer than this address set-up time. In this case, since a signal φR falls to an L level in response to the fall of the row address strobe signal /RAS, the internal circuitry operation instruction signal φE is kept at an L level continuously. In this timing relationship, the signal φE may once attain an H level to the timing of generation of signals φA and φR. The signal φE rises to an H level after a prescribed period, in response to the fall of the row address strobe signal /RAS. During this period, the RAS related circuitry operates, so that decoding of a row address signal, selection of a word line, and sensing and amplification of memory cell data by a sense amplifier are performed.

Then, if the address signal bits A <0:12> changes, the signal φE again falls to an L level. This address signals bit A <0:12> is a column address, and the column address strobe signal /CAS then falls to an L level. In this case as well, the internal circuitry operation instruction signal φE falls to an L level in response to the signals φA and φC. During this period, buffering is carried out by a column address buffer, and column selection operation and data I/O operation are performed in response to the column address strobe signal /CAS.

When one memory cycle is completed, both the row address strobe signal /RAS and the column address strobe signal /CAS attain an H level. In this condition, signals φR and φC again fall to an L level for a prescribed period, and a control signal φE responsively falls to an L level. During this period, the RAS related circuitry and the CAS related circuitry operate to return the inside to an initial state (a standby state).

Accordingly, as described above, the internal circuitry operation instruction signal φE is rendered at an L level according to the changing time of the address signal, the row address strobe signal, RAS and the column address strobe signal /CAS, whereby conductance of drive transistor 30 shown in FIG. 3 can be reduced to supply large current and reduce channel resistance thereof can be reduced to suppress reduction in the internal power supply Vint when internal power supply Vint is consumed during operation of the internal circuit, resulting in stable operation of the internal circuit. In addition, resistance of an internal power supply line is made small by reduction in channel resistance and delay of the change in internal power supply Vint due to RC delay can be reduced.

Figure 8A:
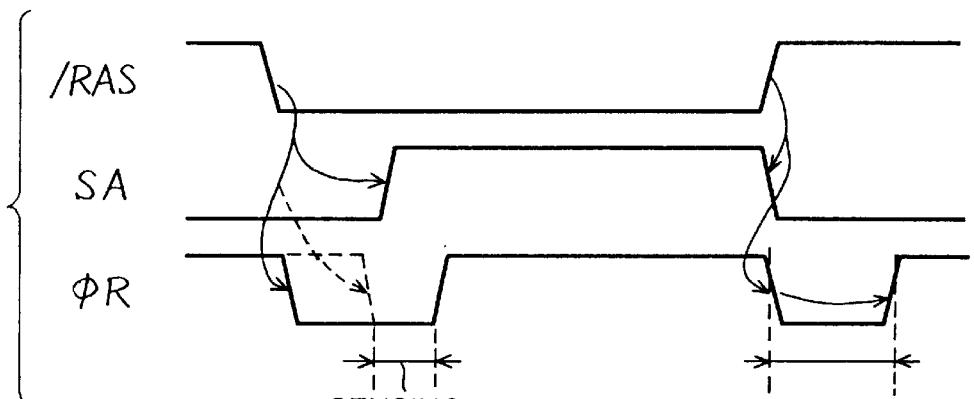
FIGS. 8A and 8B are waveform charts respectively showing operations of signal change sensing circuits for signals /RAS and /CAS shown in FIG. 6.

FIG. 8A shows the relationship between the row address strobe signal and an internal circuitry operation instruction signal φR. If the row address strobe signal /RAS falls to an L level, word line selection is performed. After a prescribed period therefrom, a sense amplifier activation signal SA is activated, and a sense amplifier operates to sense and amplify data of a selected memory cell. It is during operation of the sense amplifier that the largest amount of current is consumed in the semiconductor memory device (since a number of bit lines are charged/discharged). Accordingly, the signal φR may be rendered at an L level only during the sensing operation, as shown in a broken line in FIG. 8A. Since the sense amplifier activation signal SA is activated by a delay signal of the signal /RAS, a structure in which the signal φR is activated only during the sensing operation can be implemented easily, as will be described below in detail. In FIG. 6, for example, if delay circuit 47 is made to have a structure in which a signal is extracted from the inside of an inversion and delay circuit to be applied to NAND circuit 58, a signal φR can be set at an L level only during sensing operation.

If the row address strobe signal /RAS rises to an H level, a memory cycle is completed and the sense amplifier activation signal SA falls to an L level. In this case, an internal bit line equalize/precharge circuit and the like operate, and a row decoder and the like are reset. Accordingly, in this case, the signal φR is rendered at an L level during a period required for reset (return to an initial state) of the RAS related circuitry (circuits which operates in relation to the signal /RAS). Thus, reduction in internal power supply Vint can be surely suppressed when the internal circuitry operates and the internal power supply Vint is consumed, resulting in stable operation of the RAS related circuitry.

Figure 8B:
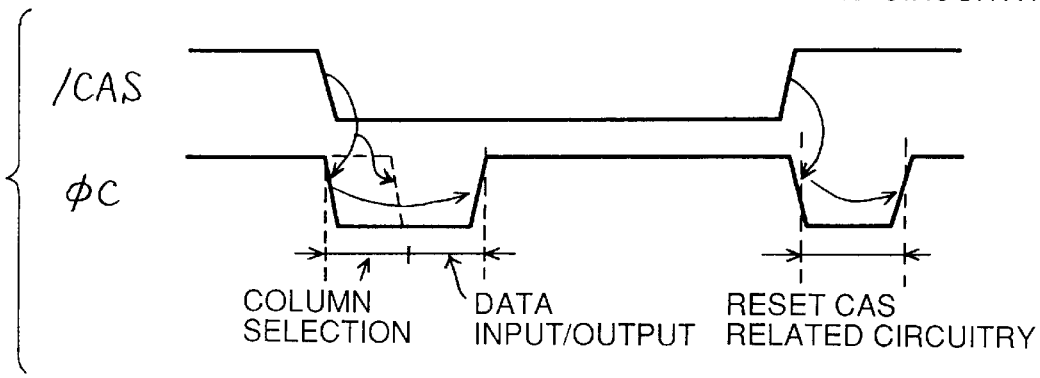

As shown in FIG. 8B, if column address strobe signal /CAS falls to an L level, signal φC falls to an L level. Normally, a column interlock period is determined in a DRAM, and activation of the internal column address signal /CAS is inhibited until the sense amplifier finishes its operation. Although column selecting operation and data I/O operation are performed, it is during data outputting operation in a data output circuit that a large amount of internal power supply Vint is consumed (because, in the case of outputting multi-bit data, a plurality of data output buffers which drive relatively large load at a high speed operate in parallel, consuming relatively large current). Accordingly, as shown in a broken line in FIG. 8B, a structure in which signal φC is set at an L level only during operation of a data output circuit after fall of column address strobe signal /CAS to an L level may be used. This structure, which will be described below in detail, can be implemented easily by using the structure of inversion and delay circuit 47 as in the case of the row address strobe signal /RAS described above or providing a delay circuit in the previous stage of the inversion and delay circuit 47.

If the column address strobe signal /CAS returns to an L level, the CAS related circuitry is reset to return to an initial state. In this case, the signal φC is at an L level for a prescribed period in response to the fall of the column address strobe signal /CAS.

The respective periods during which the signals φR and φC shown in FIGS. 8A and 8B are set at an L level are determined by a delay time of inversion and delay circuit 47 shown in FIG. 6. Accordingly, if L level periods of the signals φR and φC upon rise of the signals /RAS and /CAS are different from those upon fall of the signals /RAS and /CAS, respectively, a circuit portion for generating a pulse signal in response to the rise of the signals /RAS and /CAS and a circuit portion for generating a pulse signal in response to the fall of the signals /RAS and /CAS may be provided, thereby dealing with this problem easily.

Figure 9:
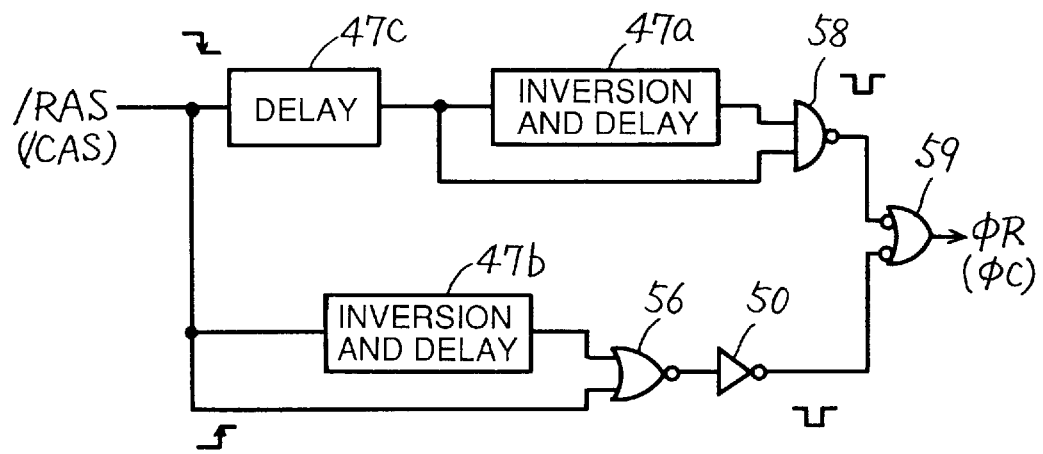
FIG. 9 is a diagram showing a modification of the signal change sensing circuit shown in FIG. 6.

FIG. 9 is a schematic diagram showing a structure of signal change sensing circuits for generating signals φR and φC shown in broken lines in FIGS. 8A and 8B, respectively. FIG. 9 shows a structure of both of respective circuits for row address strobe signal /RAS and column address strobe signal /CAS. In FIG. 9, the signal change sensing circuit includes a delay circuit 47c for delaying the row address strobe signal /RAS (or column address strobe signal /CAS) by a prescribed time period; an inversion and delay circuit 47a for inverting and delaying an output signal of delay circuit 47c by a prescribed time period; an NAND circuit 58 for receiving an output signal of delay circuit 47c and an output signal of inversion and delay circuit 47a; an inversion and delay circuit 47b for inverting and delaying the signal /RAS (or signal /CAS) by a prescribed time period; an NOR circuit 56 for receiving an output signal of inversion and delay circuit 47b and signal /RAS (or signal /CAS); an inverter circuit 50 for receiving an output signal of NOR circuit 56; and an NAND circuit 59 for receiving an output signal of NAND circuit 58 and an output signal of inverter 50. The signal φR or φC is output from NAND circuit 59.

In the structure shown in FIG. 9, the output signal of NAND circuit 58 falls to an L level after a prescribed time (a delay time of delay circuit 47c) from fall of the signal /RAS (or /CAS). The period during which the output signal of NAND circuit 58 is at an L level is determined by a delay time of inversion and delay circuit 47a. On the other hand, NOR circuit 56 and inverter 50 output a signal which is rendered at an L level for a delay time of inversion and delay circuit 47b in response to rise of the signal /RAS (or /CAS). If respective delay times of inversion and delay circuits 47a and 47b are set to appropriate values, respective L level periods of the signal φR (or φC) at the time of sensing operation or data output and at the time of reset of the RAS related circuitry (or the CAS related circuitry) can be set to appropriate values.

Delay circuit 47c is used to provide signal waveforms shown in broken lines in FIGS. 8A and 8B. Therefore, if the delay time of delay circuit 47c is set to an appropriate value, the signal φR (or φC) is surely rendered at an L level and the internal circuitry operation instruction signal φE is also rendered at an L level only during operation of a sense amplifier or data output operation which consumes the largest amount of current.

As described above, according to the first embodiment of the present invention, since internal power supply is generated using internal high voltage produced in order to drive a word line or generate a block selection signal for connection between a bit line and a sense amplifier, an internal high voltage generating circuit for generating internal power supply will not be necessary, resulting in a semiconductor memory device with small occupied area and low power consumption.

Furthermore, during operation of internal circuit, gate potential of a drive transistor which operates in a source follower mode for generating internal power supply is increased so as to reduce internal resistance. Therefore, even if large current flows through the drive transistor during operation of the internal circuit, reduction in internal power supply Vint caused by channel resistance thereof can be suppressed and the internal power supply Vint can be kept stably at a prescribed voltage level, whereby stable and high speed operation of the internal circuitry can be achieved.

Second Embodiment

Figure 10:
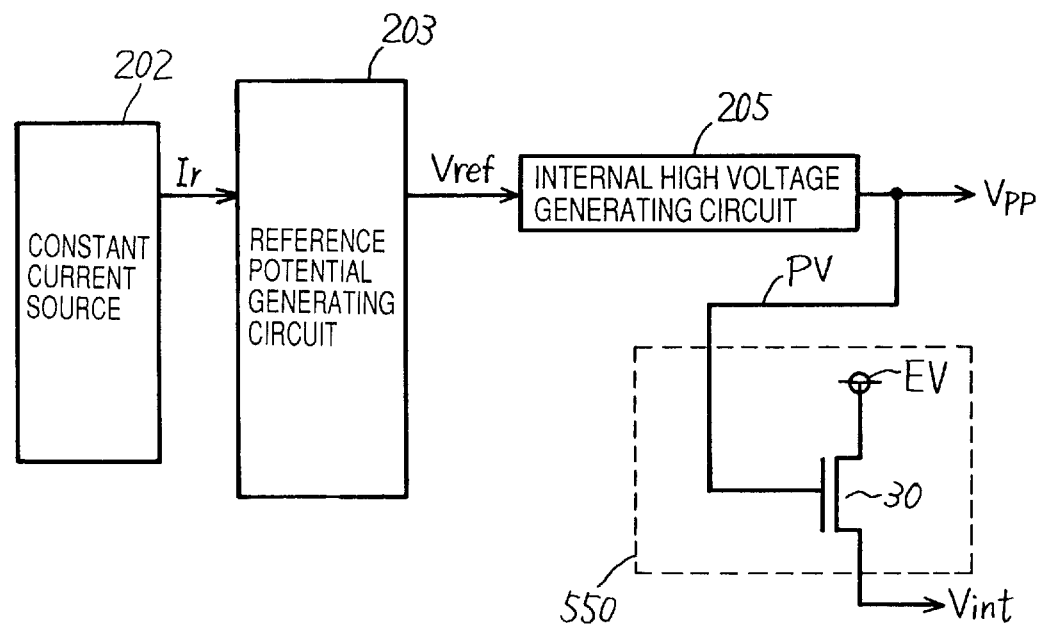
FIG. 10 is a schematic diagram showing a structure of an internal voltage generating circuit in accordance with a second embodiment of the present invention.

FIG. 10 is a diagram showing a structure of a main part of a semiconductor memory device in accordance with a second embodiment of the present invention. In the second embodiment, an internal power supply generating circuit 550 only includes a drive transistor 30 constituted by an n channel MOS transistor having its gate receiving internal high voltage Vpp generated by an internal high voltage generating circuit 205 through an internal high voltage supply line PV. Internal high voltage generating circuit 205 generates internal high voltage Vpp at a prescribed potential level according to reference potential Vref from a reference potential generating circuit 203 which uses constant current Ir from a constant current source 202, as in the case of the first embodiment. The structure thereof is similar to that of the first embodiment.

According to the second embodiment shown in FIG. 10, internal power supply Vint is at a voltage level of Vpp−Vthn. In the case where the internal power supply generating circuit of the second embodiment is used as power supply for a sense amplifier, sensing operation (restoring operation) can be performed at a high speed to charge a bit line to the internal power supply Vint (since a voltage level of the internal power supply Vint of the second embodiment is higher than that of the internal power supply Vint of the first embodiment).

In addition, if internal power supply generating circuit 550 of the second embodiment is used as a power supply circuit for a circuit portion which operates relative slowly, rapid flow of large current will not occur, and therefore, an affect of channel resistance is small, so that internal power supply Vint at a desired voltage level can be produced stably. For example, a bit line precharge voltage generating circuit other than a sense amplifier is considered as such an internal circuit which operates relatively slowly.

As described above, according to the second embodiment, a dedicated internal high voltage generating circuit is not necessary as in the case of the first embodiment, and an internal power supply generating circuit with low power consumption and small occupied area can be realized.

Third Embodiment

Figure 11:
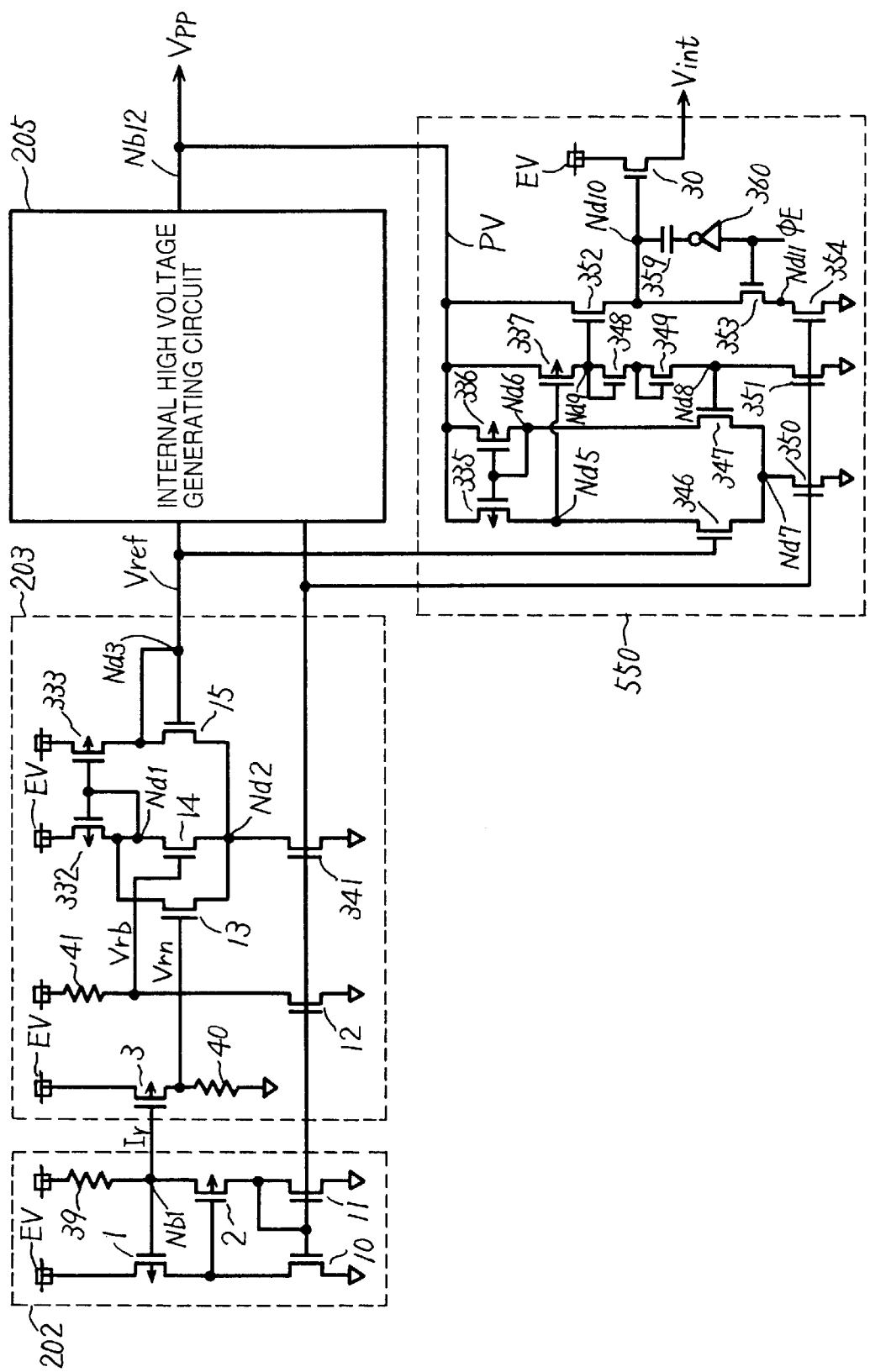
FIG. 11 is a diagram showing a structure of an internal voltage generating circuit in accordance with a third embodiment of the present invention.

FIG. 11 is a diagram showing a structure of a main part of a semiconductor memory device in accordance with a third embodiment of the present invention. A structure of an internal power supply generating circuit is shown in FIG. 11. In FIG. 11, respective structures of a constant current source 202 and an internal high voltage generating circuit 205 are the same as those of the first embodiment, and detailed description thereof will not be repeated. However, in high voltage generating circuit 205, the level of high voltage Vpp can be raised if the level detecting transistor 7 in level detecting circuit 206 (see FIG. 3) is provided in plurality in a series connection arrangement.

A reference potential generating circuit 203 is the same in structure as the first embodiment shown in FIG. 3.

This differential stage includes a p channel MOS transistor 332 connected between a power supply node EV and a node Nd1 and having its gate connected to node Nd1; an n channel MOS transistor 13 connected between node Nd1 and a node Nd2 and having its gate receiving internal potential Vrn; an n channel MOS transistor 14 connected between node Nd1 and node Nd2 and having its gate receiving internal potential Vrb; a p channel MOS transistor 333 connected between power supply node EV and a node Nd3 and having its gate connected to node Nd1; an n channel MOS transistor 15 connected between node Nd3 and node Nd2 and having its gate connected to node Nd3; an n channel MOS transistor 341 connected between node Nd2 and a ground node and having its gate connected to the respective gates of MOS transistors 10 and 11 in constant current source 202.

MOS transistors 332 and 333 constitute a current mirror circuit, and MOS transistor 341 constitutes a current mirror circuit together with MOS transistor 11. Internal potentials Vrb and Vrn are generated from a structure similar to that of the reference potential generating circuit of the first embodiment, and have a similar characteristic. Reference potential Vref is output from node Nd3.

If the reference potential Vref is higher than both internal potentials Vrb and Vrn, current flows through MOS transistor 15. Since the current flowing through MOS transistor 15 is larger than current supplied through MOS transistor 333, potential on node Nd3 falls. If the reference potential Vref is lower than at least one of the internal potentials Vrb and Vrn, large current flows through one of MOS transistors 13 and 14. This current is supplied from MOS transistor 332, and mirror current of the current flowing in MOS transistor 332 flows through MOS transistor 333. Accordingly, in this case, since current larger than current driven by MOS transistor 15 is supplied from MOS transistor 333, potential on node Nd3 rises. Therefore, the reference potential Vref is held to be at a potential level equal to that of a higher potential out of the internal potentials Vrb and Vrn, as in the case of the first and the second embodiment Internal power supply generating circuit 550 includes a p channel MOS transistor 335 connected between an internal high voltage supply node PV and a node Nd5 and having its gate connected to a node Nd6; a p channel MOS transistor 336 connected between node PV and node Nd6 and having its gate connected to node Nd6; an n channel MOS transistor 346 connected between node Nd5 and a node Nd7 and having its gate receiving reference potential Vref; an n channel MOS transistor 347 connected between node Nd6 and node Nd7 and having its gate connected to a node Nd8; and an n channel MOS transistor 350 connected between node Nd7 and the ground node and having its gate connected to the gate of MOS transistor 11 of constant current source 202. These transistors 335, 336, 346, 347 and 350 constitute a current mirror type differential amplifier for comparing reference potential Vref and potential on node Nd8.

Internal power supply generating circuit 550 further includes a p channel MOS transistor 337 connected between node PV and a node Nd9 and having its gate connected to node Nd5; diode-connected n channel MOS transistors 348 and 349 connected in series between node Nd9 and node Nd8; an n channel MOS transistor 351 connected between node Nd8 and the ground node and having its gate connected to the gate of MOS transistor 11; an n channel MOS transistor 352 connected between node PV and a node Nd10 and having its gate connected to node Nd9; an n channel MOS transistor 353 connected between node Nd10 and a node Nd11 and having its gate receiving an internal circuitry operation instruction signal φE; an n channel MOS transistor 354 connected between node Nd11 and the ground node and having its gate connected to the gate of MOS transistor 11; and an n channel MOS transistor 30 connected between power supply node EV and an internal power supply node and having its gate connected to node Nd10.

Internal power supply generating circuit 550 further includes an inverter 360 for receiving an internal circuitry operation instruction signal φE, and a capacitor 359 responsive to an output signal of inverter 360 for performing charge pumping operation to supply charges to node Nd10. The operation will now be described briefly.

Each of MOS transistors 350, 351 and 354 constitutes a current mirror circuit together with MOS transistor 11 included in constant current source 202, and functions as a constant current source for producing small current flow. If potential on node Nd8 is higher than the reference potential Vref, current flowing through MOS transistor 347 is larger than that flowing through MOS transistor 346. MOS transistors 335 and 336 constitute a current mirror circuit, and MOS transistor 336 constitute a master stage of this current mirror circuit. Therefore, in this condition, potential on node Nd5 rises, and conductance of MOS transistor 337 reduces accordingly. On the contrary, if the potential on node Nd8 is lower than the reference potential Vref, current flowing through MOS transistor 346 is larger than that flowing through MOS transistor 347, and therefore, the potential of node Nd5 falls and the conductance of MOS transistor 337 increases. Accordingly, the potential on node Nd5 is adjusted so that the potential on node Nd8 is equal to the reference potential Vref.

Since MOS transistor 351 merely supply small current, MOS transistors 348 and 349 operate in a diode mode, and cause potential drop of respective threshold voltages Vthn. Accordingly, potential of node Nd9 is held to be at a potential level of Vref+2•Vthn.

In addition, since MOS transistor 354 functions as a constant current source for supplying small current, the potential difference between the gate and the source of MOS transistor 352 is made equal to a threshold voltage Vthn. Therefore, potential on node Nd10 is Vref+Vthn.

MOS transistor 30 operates in a source follower mode, and the potential difference between the gate and the source of MOS transistor 30 is a threshold voltage Vthn thereof. Accordingly, the internal power supply Vint is equal to the reference potential Vref.

According to the structure of the third embodiment, the internal power supply Vint is made equal to the reference potential Vref and does not depend on a voltage level of the internal high voltage Vpp. Consequently, the voltage level of the internal high voltage Vpp from internal high voltage generating circuit 205 can be set to a desired value independently of a power supply level of the internal power supply Vint, resulting in increase in the degree of freedom in circuit design.

Furthermore, the internal power supply Vint is not affected by threshold voltages of MOS transistors included in internal power supply voltage generating circuit 550, and is made equal to the reference potential Vref. The reference potential Vref is substantially determined by constant current Ir supplied by constant current source 202 and resistance elements 40 and 41 in reference potential generating circuit 203 (more precisely, the reference potential Vref is affected by an amount of mirror currents of MOS transistors 3 and 12). Accordingly, in the case where the reference potential Vref is kept stably at a constant voltage level, even if threshold voltages of MOS transistors in internal power supply voltage generating circuit 550 vary due to variation in manufacturing parameters, internal power supply Vint at a desired voltage level can be surely produced without being affected by the parameter variation.

In addition, if the reference potential Vref has little temperature dependency, the internal power supply Vint can be held stably at a desired voltage level without being affected by the temperature dependency of threshold voltages Vthn and Vthp of MOS transistors.

During operation of the internal circuit, an internal circuitry operation instruction signal φE is rendered at an L level, MOS transistor 353 is turned off, charges are injected into node Nd10 by charge pumping capacitor 359, and channel resistance of transistor 30 is reduced to supply large current to the inside, as in the case of the first embodiment. During rise of potential of node Nd10, MOS transistor 352 is surely turned off since gate potential thereof is fixed to Vref+2•Vthn and the potential difference between the gate and the source thereof is smaller than the threshold voltage, and it is accordingly ensured that charges supplied from capacitor 359 to node Nd10 are used only to increase the gate potential of drive transistor 30.

As described above, according to the third embodiment, since the internal power supply generating circuit operates with internal high voltage Vpp as one operating power supply voltage and produces internal power supply Vint, an internal high voltage generating circuit dedicated to internal power supply is not necessary, thereby achieving reduction in power consumption.

Furthermore, since internal voltage at a desired voltage level is produced in a current mirror type differential amplifier using small current as operating current and internal power supply Vint is generated according to this internal voltage through a plurality of stages (two stages in the present embodiment) of MOS transistors which operate in a source follower mode, the internal power supply Vint can be made equal to the reference potential Vref and an effect of threshold voltages of MOS transistors on the internal power supply Vint can be eliminated, so that internal power supply at a desired voltage level can be produced stably without being affected by manufacturing parameters, operating temperature and the like.

In addition, since the voltage level of internal high voltage Vpp can be made independent of that of internal power supply Vint, the voltage level of internal high voltage Vpp can be set to a desired voltage level, so that degree of freedom in design of an internal high voltage generating circuit is increased and internal power supply at a required voltage level can be easily produced from an internal high voltage generating circuit for generating appropriate internal high voltage.

Furthermore, since the gate potential of a drive transistor is increased during operation of the internal circuit, voltage drop caused by channel resistance of the drive transistor can be reduced during operation of the internal circuit, and reduction in the voltage level of internal power supply Vint can be accordingly suppressed, and internal power supply at a stable voltage level can be supplied to the internal circuit, resulting in stable and high speed operation of the internal circuit.

Fourth Embodiment

Figure 12:
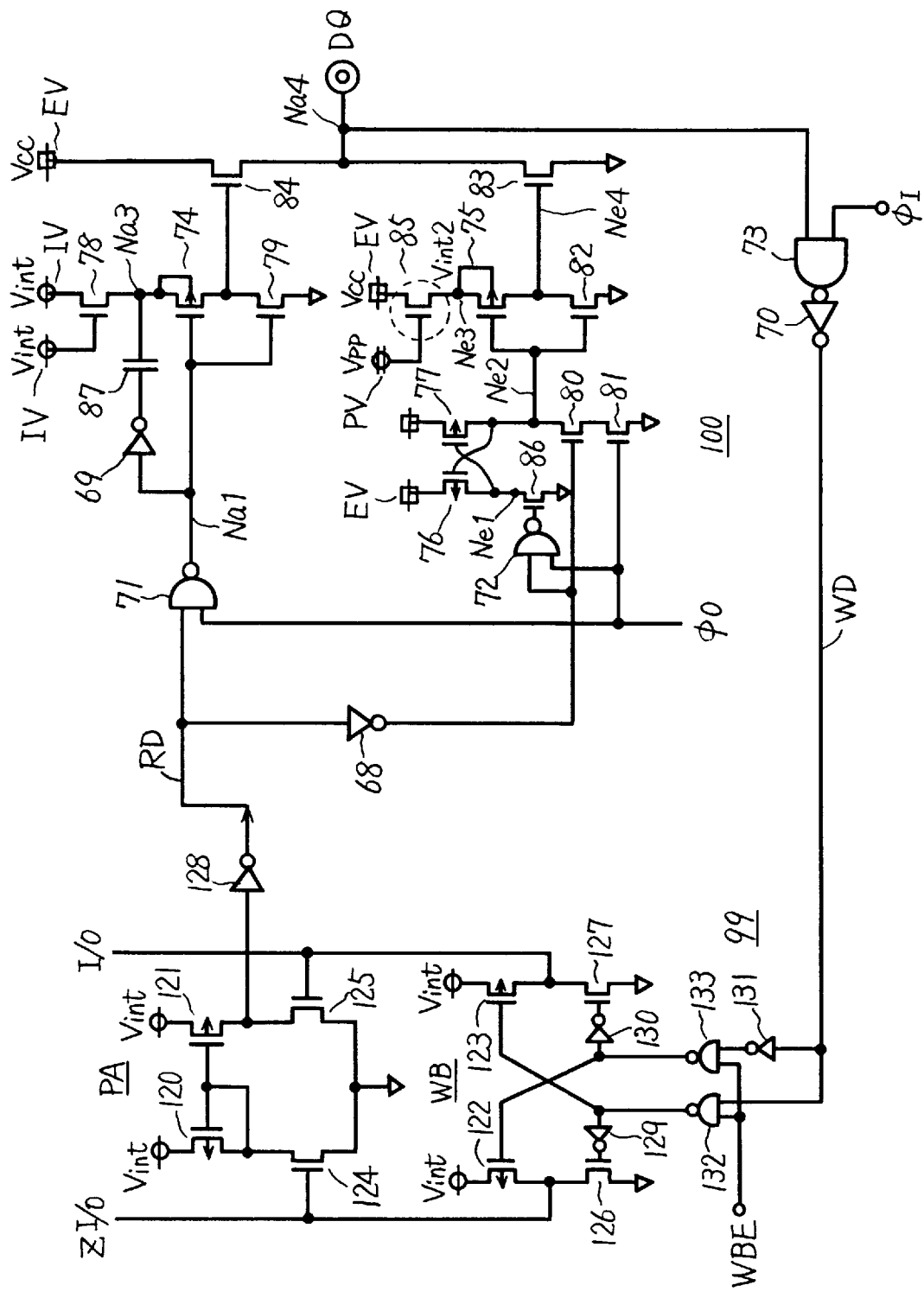
FIG. 12 is a diagram showing a structure of a data I/O portion of a semiconductor memory device in accordance with a fourth embodiment of the present invention.

FIG. 12 is a diagram showing a structure of a main part of a semiconductor memory device in accordance with a fourth embodiment of the present invention. In the fourth embodiment shown in FIG. 12, a power supply circuit in accordance with the fourth embodiment of the present invention is provided for an output circuit portion in a data I/O circuit. Brief description of a structure of a data I/O portion of the semiconductor memory device will now be given before giving description of a structure of the power supply circuit.

In FIG. 12, respective structures of read/write amplifier 99 and I/O circuit 100 of FIG. 1 are shown. Read/write amplifier 99 includes a read amplifier PA constituted by a current mirror type differential amplifier for differentially amplifying complementary data on respective I/O data lines I/O and ZI/O to produce internal read data, and a write amplifier WB for producing complementary internal write data from data on a write data line WD.

Read amplifier PA includes p channel MOS transistors 120 and 121 constituting a current mirror circuit, and n channel MOS transistors 124 and 125 for comparing respective signal potentials on I/O data lines I/O and ZI/O with each other. MOS transistor 120 constitutes a master stage of the current mirror circuit, and a signal output from the drain of MOS transistor 121 is transmitted onto a read data line RD through an inverter 128.

Write amplifier WB includes an inverter 131 for inverting a potential on write data line WD; an NAND circuit 132 for receiving a write activation signal WBE and write data on write data line WD; an NAND circuit 133 for receiving an output signal of inverter 131 and the write activation signal WBE; inverters 129 and 130 for inverting output signals of NAND circuits 132 and 133, respectively; a p channel MOS transistor 122 responsive to an output signal of NAND circuit 133 for charging I/O data line ZI/O to an internal power supply Vint level; a p channel MOS transistor 123 responsive to an output signal of NAND circuit 132 for charging I/O data line I/O to the internal power supply Vint level; an n channel MOS transistor 126 responsive to an output signal of inverter 129 for discharging I/O data line ZI/O to a ground potential level; and an n channel MOS transistor 127 responsive to an output signal of inverter 130 for discharging I/O data line I/O to the ground potential level.

During data read operation, read amplifier PA operates at all times, and signal potentials respectively read onto I/O data lines I/O and ZI/O are differentially amplified to be applied to inverter 128. This read amplifier PA operates with internal power supply Vint as one operating power supply voltage, and internal read data transmitted from inverter 128 onto read data line RD is either at the internal power supply Vint level or the ground potential level. During data read operation, write activation signal WBE is at an L level and respective output signals of NAND circuits 122 and 133 are at an H level, and respective output signals of inverters 129 and 130 are accordingly at an L level. Therefore, all of the MOS transistors 122, 123, 126 and 127 are off, and potential on write data line WD is inhibited from being transmitted to I/O data lines I/O and ZI/O.

During data write operation, the write activation signal WBE is at an H level, and NAND circuits 132 and 133 function as inverters. Thus, complementary write data corresponding to the internal write data transmitted onto write data line WD are produced. It is assumed that an output signal of NAND circuit 132 is now at an H level and an output signal of NAND circuit 133 is at an L level. In this condition, MOS transistors 123 and 126 are turned off, and MOS transistors 122 and 127 are turned on. Accordingly, I/O data line ZI/O is charged to the internal power supply Vint level and I/O data line I/O is discharged to the ground potential level.

The data output portion of I/O circuit 100 includes an output path of a signal at an H level of the power supply voltage Vcc level, and an output path of a signal at an L level of the ground potential level. The output path of a signal at an H level includes an NAND circuit 71 for receiving a signal on read data line RD and a read instruction signal φO; an inverter 69 for receiving a signal from an output node Na1 of NAND circuit 71; a capacitor 87 responsive to an output signal of inverter 69 for transmitting charges to a node Na3 by charge pumping operation; a diode-connected n channel MOS transistor 78 connected between an internal power supply node IV and node Na3; an n channel MOS transistor 84 connected between an external power supply node EV and an output node Na4; a p channel MOS transistor 74 connected between node Na3 and the gate of MOS transistor 84 and having its gate connected to node Na1; and an n channel MOS transistor 79 connected between the gate of MOS transistor 84 and a ground node and having its gate connected to node Na1.

Node Na3 is clamped to the voltage level of Vint−Vthn. When a potential level of node Na1 is an L level, an output signal of inverter 69 attains an H level and a potential on node Na3 is made to be at the level of 2•Vint−Vthn by charge pumping operation of capacitor 87. The potential on node Na3 is transmitted to the gate of MOS transistor 84 of the output portion. Thus, voltage at the power supply voltage Vcc level is transmitted from external power supply node EV to output node Na4.

When a voltage level on node Na1 is an H level, an output signal of inverter 69 falls to an L level and a potential on node Na3 is held at the level of Vint−Vthn by MOS transistor 78. The signal at an H level on node Na1 is a signal at the internal power supply Vint level, and MOS transistor 74 is turned off and MOS transistor 79 is turned on. Thus, gate potential of MOS transistor 84 in the output portion falls to the ground potential level, whereby MOS transistor 84 is turned off.

The output path of a signal at an L level includes an inverter 68 for receiving a signal on read data line RD; an NAND circuit 72 for receiving an output signal of inverter 68 and a read instruction signal φO; a p channel MOS transistor 76 connected between external power supply EV and a node Ne1 and having its gate connected to a node Ne2; an n channel MOS transistor 86 connected between node Ne1 and the ground node and having its gate receiving an output signal of NAND circuit 72; a p channel MOS transistor 77 connected between power supply node EV and node Ne2 and having its gate connected to node Ne1; and n channel MOS transistors 80 and 81 connected in series between node Ne2 and the ground node. MOS transistor 80 has its gate receiving an output signal of inverter 68, and MOS transistor 81 has its gate receiving the output instruction signal φO.

If the output instruction signal φO is inactive at an L level, MOS transistor 81 is turned off and an output signal of NAND circuit 72 is set at an H level. In this condition, MOS transistor 86 is turned on, and potential on node Ne1 is accordingly reduced to the ground potential level, so that MOS transistor 77 is turned on and node Ne2 is charged to the power supply voltage Vcc level. During data read operation, that is, when the read instruction signal φO is at an H level, MOS transistor 81 is turned on. Since NAND circuit 72 functions as an inverter, one of MOS transistors 80 and 86 is turned on and the other is turned off. When an output signal of NAND circuit 72 is at an L level, MOS transistor 80 is turned on, and therefore, node Ne2 is discharged to the ground potential level, MOS transistor 76 is accordingly turned on, and node Ne1 is charged to the power supply voltage Vcc level. More specifically, MOS transistors 76, 77, 80, 81 and 86 and NAND circuit 72 have a level converting function to convert internal read data at an L level from inverter 68 into data at the power supply voltage Vcc level to output the converted data to node Ne2.

This output path of a signal at an L level further includes a power supply circuit 85 constituted by an n channel MOS transistor connected between external power supply node EV and a node Ne3 and having its gate connected, to a high voltage application node PV; a p channel MOS transistor 75 connected between node Ne3 and a node Ne4 and having its gate connected to node Ne2; an n channel MOS transistor 82 connected between node Ne4 and the ground node and having its gate connected to node Ne2; and an n channel MOS transistor 83 connected between output node Na4 and the ground node and having its gate connected to node Ne4.

Voltage Vint2 on node Ne3 is charged to Vpp−Vthn(85) by the MOS transistor in power supply circuit 85. Internal power supply Vint is to be at the level of Vpp−2•Vthn by the circuit of the first embodiment. Therefore, power supply Vint2 on node Ne3 is set to a voltage level higher than that of the internal power supply Vint, as shown in FIG. 4. When node Ne2 is at an L level, MOS transistor 75 is turned on, so that the power supply Vint2 is transmitted to node Ne4.

Consequently, since MOS transistor 83 operates with its gate receiving the power supply Vint2 higher than the internal power supply Vint, it can discharge output node Na4 to the ground potential level with a large current driving capability. Channel width of MOS transistor 83 need not be increased in order to improve the driving capability thereof, and parasitic capacitance accompanying output node Na4 can be accordingly reduced, so that output node Na4 can be discharged quickly.

Guaranteed operating voltage of external power supply voltage Vcc is in the range from 3.0 V to 3.6 V. Therefore, in the case where the channel width of MOS transistor 83 is set so that desired current driving capability can be obtained with power supply voltage Vcc of 3 V, if the external power supply voltage Vcc is 3.6 V, the current driving capability of MOS transistor 83 is improved and noise such as ringing might occur at output node Na4. As shown in FIG. 12, however, if power supply Vint2 applied to the gate of MOS transistor 83 is made lower than the external power supply voltage Vcc by power supply circuit 85, generation of noise such as ringing can be surely suppressed. For example, if Vpp, Vint and Vint2 are respectively set to 3.6 V, 2 V and 2.8 V, the power supply voltage Vint2 is constant at 2.8 V with guaranteed operating voltage Vcc being in the range from 3.0 V to 3.6 V, as shown in FIG. 4. Accordingly, if the channel width of MOS transistor 83 is set so that desired current driving capability can be obtained with Vint2 of 2.8 V, MOS transistor 83 can discharge output node Na4 with constant current driving capability regardless of variation in external power supply voltage Vcc, and generation of noise such as ringing can be surely prevented.

Furthermore, internal high voltage used for word line selection and the like is utilized for the internal high voltage Vpp, as in the case of the first to third embodiments. However, this internal high voltage Vpp is merely applied to the gate of the MOS transistor in power supply circuit 85 and there is no path for discharging the internal high voltage supply node PV. Accordingly, internal high voltage Vpp from the internal high voltage generating circuit is not consumed, and therefore, power consumption of the internal high voltage generating circuit will not be increased at all even if internal power supply Vint2 is generated by such power supply circuit 85. Thus, a data output circuit capable of outputting data at a high speed with low power consumption can be obtained.

The data input portion of I/O circuit 100 includes an NAND circuit 73 for receiving a signal on I/O node Na4 and a data write instruction signal φI, and an inverter 70 for inverting an output signal of NAND circuit 73 and transmitting the inverted signal to write data line WD. This NAND circuit 73 receives signal potential on I/O node Na4. More specifically, output node Na4 also functions as a data input node. Therefore, if the channel width and the parasitic capacitance of MOS transistor 83 are small, parasitic capacitance of data I/O node Na4 is reduced. Consequently, an external device can quickly charge/discharge this node Na4 during data write operation, resulting in high speed data write operation.

Thus, a semiconductor memory device capable of inputting/outputting data at a high speed with low power consumption can be obtained.

As described above, according to the fourth embodiment, since internal voltage at a level between external power supply voltage Vcc and internal power supply Vint used in internal circuitry is generated from internal high voltage in a source follower mode and is applied to the gate of an MOS transistor for discharging a data I/O node, high speed input/output of data can be achieved without increase in parasitic capacitance of the data I/O node. In addition, since internal high voltage is transmitted in a source follower mode to generate second internal power supply Vint2, the internal high voltage is not consumed at all and current consumption will not be increased. Thus, a semiconductor memory device operating at a high speed with low current consumption can be realized.

It is noted that input/output of data is performed through the same node Na4 in the fourth embodiment. However, similar effects can be obtained even if separate nodes are provided for data input and for data output.

Another Application

Figure 13:
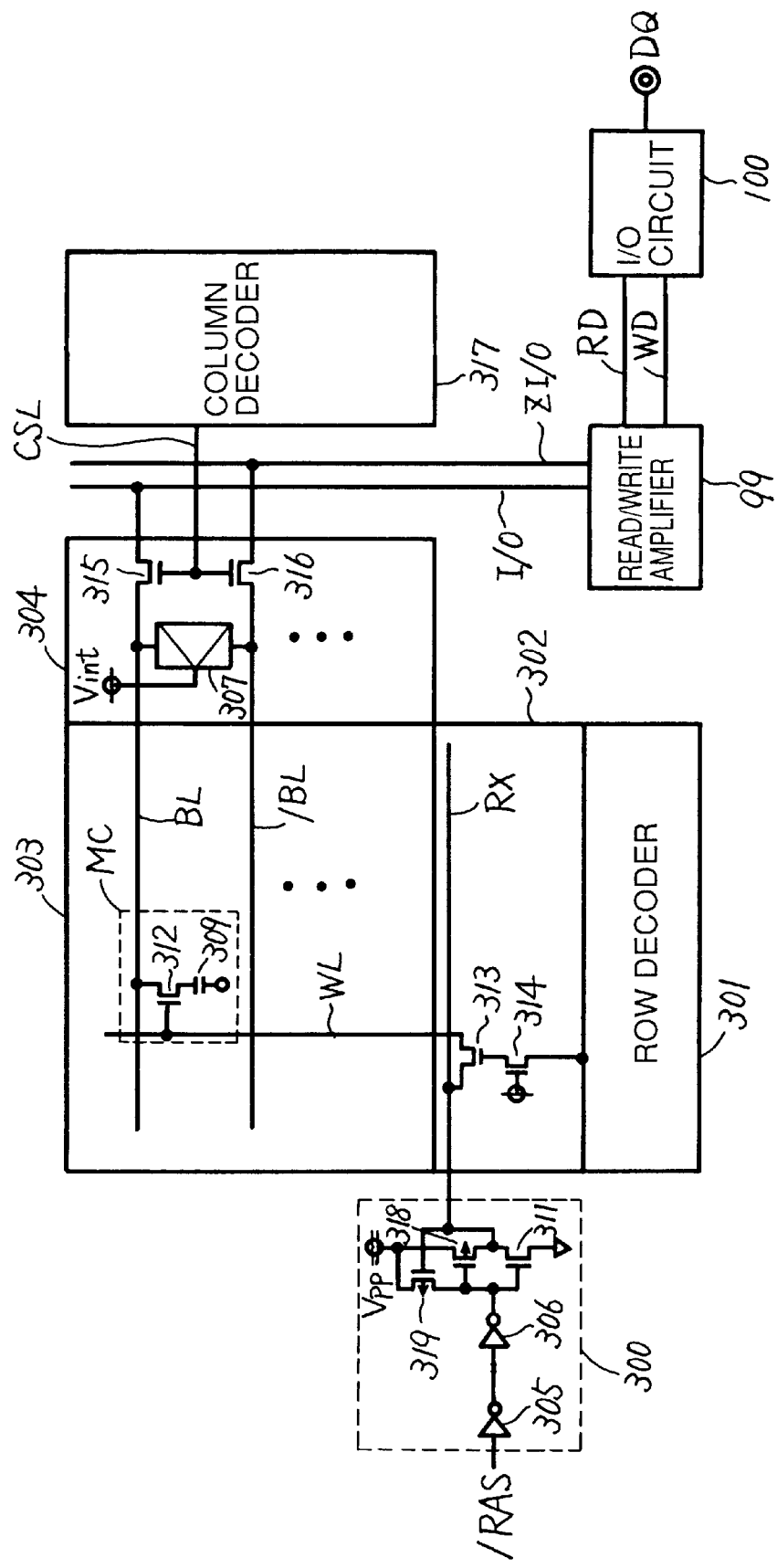
FIG. 13 is a diagram showing another structure of a semiconductor memory device to which the present invention is applied.

FIG. 13 is a diagram showing another structure of a semiconductor memory device to which the present invention is applied. In the semiconductor memory device shown in FIG. 13, a sense.IO circuit 304 is provided only for a memory cell array 303. Memory cell array 303 includes memory cells MCs arranged in rows and columns, a plurality of bit line pairs BLs and /BLs located corresponding to memory cell columns, and a word line WL provided for each memory cell row. In FIG. 13, a single word line WL, a single pair of bit lines BL and /BL, and a memory cell MC located corresponding to the intersection of the bit line BL and the word line WL are shown representatively. Memory cell MC includes a capacitor 309, and an access transistor 312 responsive to potential on word line WL for connecting capacitor 309 to bit line BL.

Sense•IO circuit 304 includes a sense amplifier 307 provided for each bit line pair BL and /BL, and column select gates 315 and 316 provided for each bit line pair for coupling a corresponding bit line pair to I/O data lines I/O and ZI/O, respectively, in response to a column selection signal φSL from a column decoder 317.

The semiconductor memory device further includes a row decoder 301 for decoding a row address signal which is not shown and generating a row designating signal; a word line driver 302 responsive to the row designating signal from row decoder 301 for transmitting a word line driving signal onto a corresponding word line WL; and a word line driving potential generating circuit 300 for generating high voltage to be transmitted by word line driver 302.

Word line driver 302 is provided corresponding to each word line WL, and includes a decoupling transistor 314 for receiving a corresponding output signal of row decoder 301, and an MOS transistor 313 responsive to a signal transmitted through decoupling transistor 314 for conducting and transmitting a driving signal RX to a corresponding word line WL. These MOS transistors 313 and 314 constitute a word line driving circuit and are provided for each word line.

Word line driving potential generating circuit 300 includes an inverter 305 for receiving a row address strobe signal /RAS, an inverter 306 for receiving an output signal of inverter 305, and a CMOS inverter for operating with internal high voltage Vpp as one operating power supply voltage and inverting an output signal of inverter 306 to generate a word line driving signal RX. This CMOS inverter includes a p channel MOS transistor 318 and an n channel MOS transistor 311. A p channel MOS transistor 319 is rendered conductive if the word line driving signal RX is at an L level, and transmits internal high voltage Vpp to the gate of MOS transistor 318, causing MOS transistor 318 to be turned off.

A read/write amplifier 99 is provided for I/O data lines I/O and ZI/O, and is coupled to an I/O circuit 100 through a read data line RD and a write data line WD. Since the semiconductor memory device shown in FIG. 13 does not have a shared sense amplifier structure, different from the structure of the semiconductor memory device shown in FIG. 1, a circuit for generating a block selection signal for separating a sense amplifier and a non-selected memory cell array from each other is not provided. The operation of the semiconductor memory device shown in FIG. 13 will now be described briefly.

A memory cycle is initiated when row address strobe signal /RAS falls to an L level. First, row decoder 301 decodes an address signal applied through a path which is not shown, and generates a row designating signal. In word line driving potential generating circuit 300, an output signal of inverter 305 rises to an H level, an output signal of inverter 306 then falls to an L level, MOS transistor 318 is turned on, and word line driving voltage at an internal high voltage Vpp level is transmitted as a word line driving signal RX. When the row designating signal from row decoder 301 designates word line WL, decoupling transistor 314 is receiving internal voltage Vint at its gate, and therefore, gate potential of MOS transistor 313 is at the level of Vint−Vthn.

If the word line driving signal RX is raised, gate potential of MOS transistor 313 is boosted to the level of Vpp+Vint−Vthn due to the self-boost effect by capacitance between the gate and the source of MOS transistor 313. Therefore, voltage at the internal high voltage Vpp level is transmitted as word line driving signal RX onto word line WL. After data in memory cell MC connected to that word line WL is read onto bit lines BL and /BL and then sensed and amplified by a sense amplifier 307, data is read or written, which is the same as in the case of the first embodiment.

Word line driving signal RX is generated using high voltage Vpp higher than internal power supply Vint in the structure of the semiconductor memory device as shown in FIG. 13 as well. Accordingly, a semiconductor memory device using high voltage Vpp for word line driving could generate internal power supply Vint utilizing this internal high voltage Vpp, even if the semiconductor memory device is not provided with the structure of a shared sense amplifier.

In addition, a DRAM (Dynamic Random Access Memory) is shown in the above embodiments. However, present invention would be applicable to a semiconductor device which has a circuit for generating internal high voltage for word line driving and the like, and produces internal power supply voltage lower than external power supply voltage to use the internal power supply as operating power supply voltage.

Fifth Embodiment

Figure 14A:
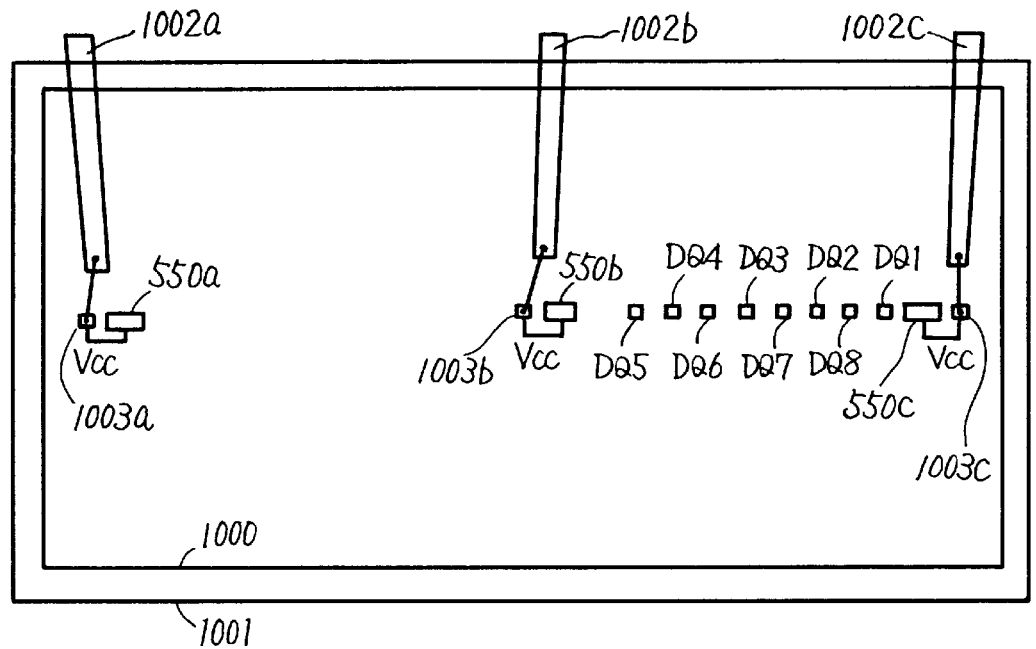
FIGS. 14A and 14B are diagrams respectively showing chip layouts of a semiconductor device in accordance with a fifth embodiment of the present invention.
Figure 14B:
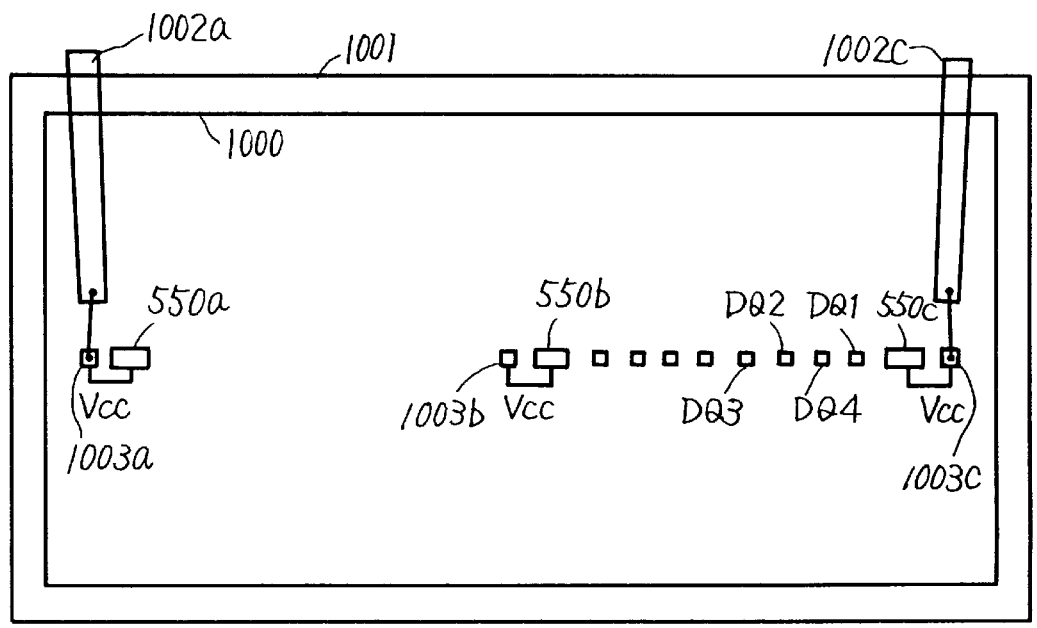

FIGS. 14A and 14B schematically show layouts of a semiconductor device in accordance with a fifth embodiment of the present invention. In the figures, only a lead frame for transmitting external power supply voltage Vcc is shown and another lead frame is not shown, for simplicity. A package of a device with x 8 structure is standardized to be provided with three power supply lead frames, and a package of a device with x 4 structure is standardized to be provided with two power supply lead frames. In FIG. 14A, a semiconductor chip 1000 is accommodated in a package 1001. Data I/O pad portions DQ1–DQ8 are located in the center of semiconductor chip 1000 in line with each other. DQ pad portions DQ1–DQ8 include data I/O pads and data I/O buffer circuits (see FIGS. 1 and 12). Power supply pads 1003b and 1003c are located on both ends of data I/O pad portions DQ1–DQ8, and internal power supply voltage generating circuits 550b and 550c are positioned adjacent to power supply pads 1003b and 1003c, respectively. Internal power supply voltage generating circuits 550b and 550c are coupled to receive power supply voltage Vcc from adjacent power supply pads 1003b and 1003c, respectively.

Internal power supply voltage generating circuits 550b and 550c down-convert the power supply voltage Vcc applied from adjacent power supply pads 1003b and 1003c, respectively, to produce internal power supply voltage, for supplying to the data I/O circuit portions in DQ pad portions DQ1–DQB (this power supply voltage may be also supplied to internal circuitry other than the data I/O circuit simultaneously).

A power supply pad 1003a is located in the left-side end of the figure in chip 1000, and an internal power supply voltage generating circuit 550a is positioned adjacent to power supply pad 1003a. Internal power supply voltage generating circuit 550a receives power supply voltage Vcc from power supply pad 1003a and generates internal power supply voltage. Power supply pads 1003a, 1003b and 1003c are electrically connected to frame leads (external pin terminals), respectively and receive externally applied power supply voltage Vcc. This internal power supply voltage generating circuit 550a supplies internal power supply voltage to internal circuitry other than the data I/O circuit (it may also supply the internal power supply voltage to the data I/O circuit).

Power supply pads 1003b and 1003c supply external power supply voltage Vcc to the I/O circuit portions of data I/O pad portions DQ1–DQ8. Internal power supply voltage generating circuits 550b and 550c are respectively located adjacent to power supply pads 1003b and 1003c, whereby internal power supply voltage can be supplied stably to the data I/O circuit portions in DQ pad portions DQ1–DQ8.

Each of internal power supply voltage generating circuits 550a–550c may have an internal structure of an internal power supply voltage generating circuit (internal voltage down-converter) similar to the conventional example, rather than the internal structure of the circuit for generating internal power supply voltage from internal high voltage as described above in the first to fourth embodiments. In addition, internal power supply voltage generating circuits 550a–550c may be coupled to a common power supply line, or may be connected to separate and independent power supply lines.

In FIG. 14B, only DQ1–DQ4 out of DQ pad portions DQ1–DQ8 are used. More specifically, in FIG. 14A, 8-bit data is input/output. On the other hand, in the structure shown in FIG. 14, data is input/output by 4 bits. In this structure as well, internal power supply voltage generating circuits 550a, 550b and 550c are located corresponding to power supply pads 1003a, 1003b and 1003c, respectively. Power supply pads 1003a and 1003c are connected through external leads to external pin terminals 1002a and 1002c, respectively, and receive externally applied power supply voltage Vcc. Power supply pad 1003b is free and is not connected to an external lead terminal.

Figure 15:
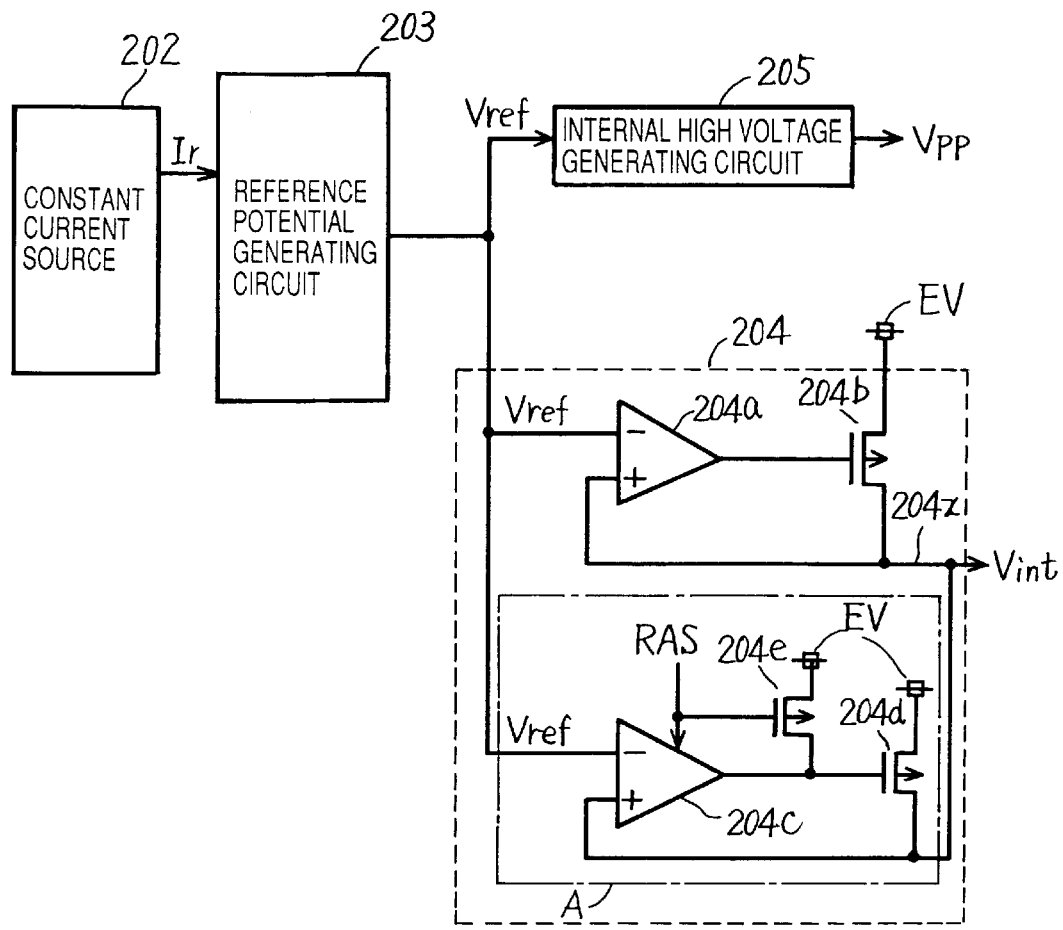
FIG. 15 is a diagram showing a structure of a conventional internal power supply voltage generating circuit.
Figure 16:
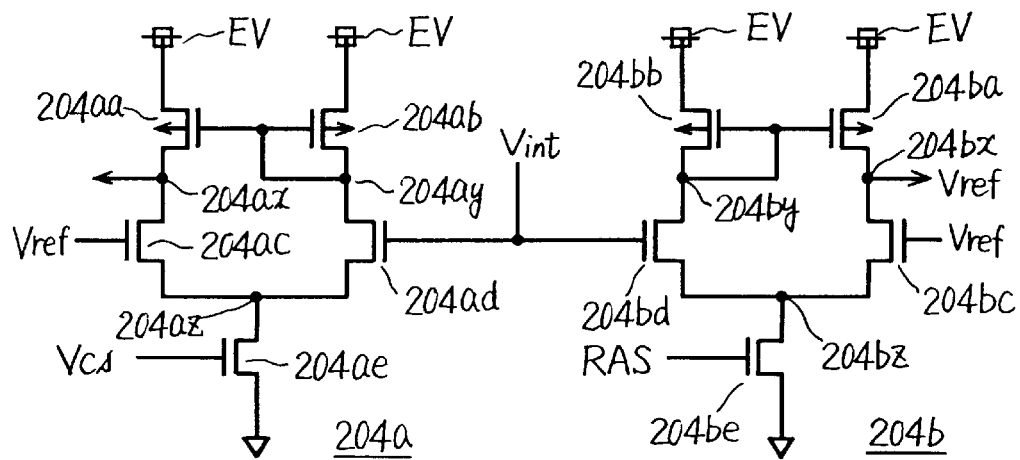
FIG. 16 is a diagram showing a structure of a differential amplifier shown in FIG. 15.
Figure 17:
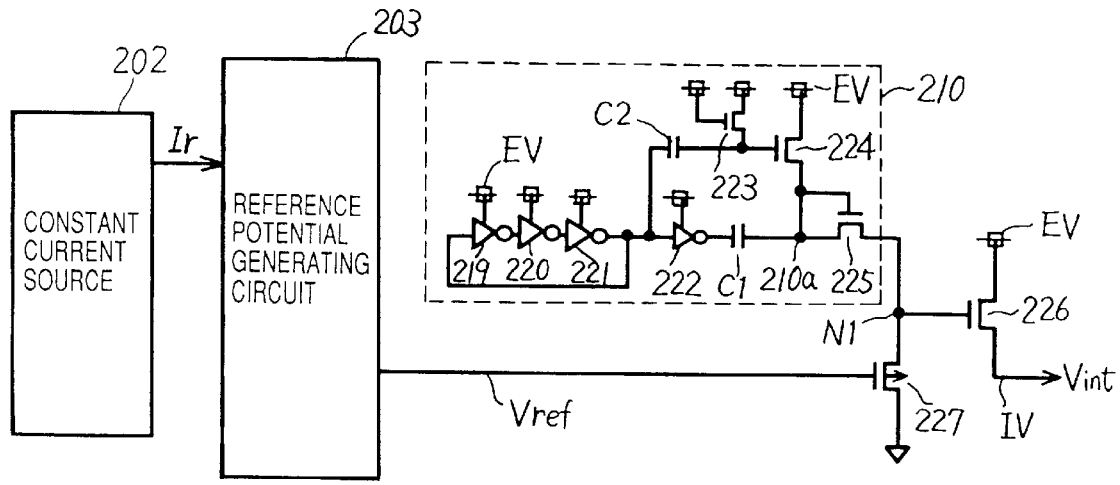
FIG. 17 is a diagram showing another structure of a conventional internal power supply voltage generating circuit.
Figure 18:
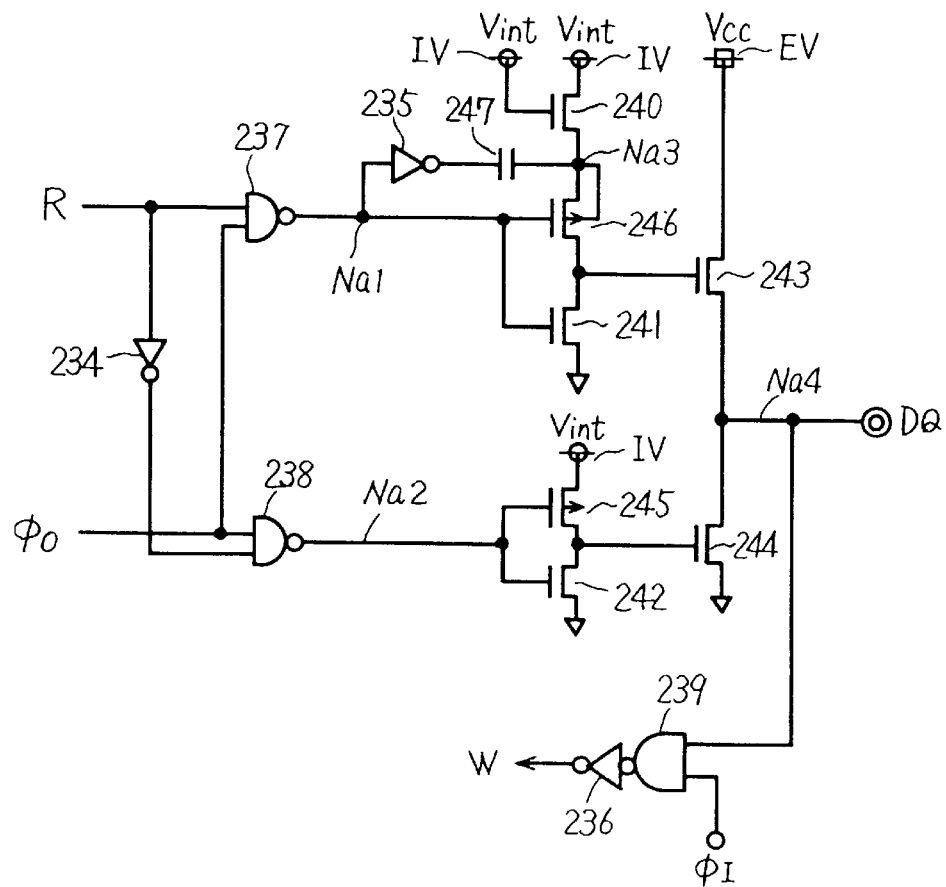
FIG. 18 is a diagram showing a structure of a conventional data I/O circuit.

Therefore, in this case, internal power supply voltage generating circuit 550b does not operate at all. In addition, in the case where the circuit 550 shown in FIG. 3 is used, if gate potential of MOS transistor 29 and a signal φE are fixed to an "L" level, power consumption is further reduced. Furthermore, in the case where a circuit (a block A shown by a chain dotted line in FIG. 15) constituted by elements 204c, 204e and 204d of FIG. 15 is used, if a signal RAS applied to elements 204c and 204e is rendered to be at an "L" level to deactivate the circuit A, power consumption is further reduced. Internal power supply voltage from internal power supply voltage generating circuit 550c is supplied to the data I/O circuit portions in DQ pad portions DQ1–DQ4, and external power supply voltage Vcc is also supplied thereto.

In this case, the number of data I/O circuit portions which operate simultaneously is half that in the case of the structure shown in FIG. 14A, and internal power supply voltage can be stably supplied to the data I/O circuit portions of DQ pad portions DQ1–DQ4, using a single internal power supply voltage generating circuit 550c.

In semiconductor memory devices, arrangements of pads and internal circuitry are made identical, and the number of bits of data is selected by adjusting the number of data pins. The number of internal power supply voltage generating circuits which operate according to the data I/O circuit portions (the number of bits of input/output data) which operate simultaneously can be adjusted by providing internal power supply voltage generating circuits for power supply pads 1003a–1003c, respectively. Thus, the number of internal power supply voltage generating circuits can be adjusted according to current consumed in the data I/O circuit portions, and as shown in FIG. 14A, the number of internal power supply voltage generating circuits is increased with increase in the number of I/O circuit portions which operate simultaneously, so that internal power supply can be supplied stably.

It is noted that an LOC (Lead on Chip) structure in which pads are located in the center of semiconductor chip 1000 is shown in each of FIGS. 14A and 14B. However, even if the pad arrangement is a "side pad" arrangement in which pads are located on both sides of a semiconductor chip, similar effects can be obtained by providing internal power supply voltage generating circuits for power supply pads, respectively.

As has been described above, according to the present invention, since necessary internal power supply voltage is formed using internal high voltage utilized in another circuit, a semiconductor device which operates at a high speed with low power consumption can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   an internal high voltage generating circuit for generating an internal high voltage higher than an internal power supply voltage to apply said internal high voltage to a prescribed internal circuit related to a memory cell selection operation;
   a driving voltage generating circuit for receiving said internal high voltage and generating a driving voltage corresponding to the internal high voltage; and
   a drive transistors, coupled between an external power supply node receiving an external power supply voltage and an internal power supply node providing said internal power supply voltage, for supplying electric charges from said external power supply node to said internal power supply node based on said driving voltage being applied to a control electrode of said drive transistor.

2. The semiconductor memory device according to claim 1, wherein
   said driving voltage generating circuit includes an interconnection line for transmitting said internal high voltage to said control electrode of said drive transistor.

3. The semiconductor memory device according to claim 1, wherein
   said driving voltage generating circuit includes
   a diode element coupled between a supply node receiving said internal high voltage and said control electrode of said drive transistor in a forward direction from the supply node.

4. The semiconductor memory device according to claim 1, wherein:
   said drive transistor is an insulated gate type field effect transistor having a threshold voltage and operating in a source follower mode, and
   said driving voltage generating circuit includes voltage applying means operating with said internal high voltage as one operating power supply voltage, and for receiving a reference voltage lower than said internal high voltage and generating a voltage higher than the reference voltage by said threshold voltage for application to said control electrode of said drive transistor.

5. The semiconductor memory device according to claim 4, wherein said voltage applying means includes:

differential comparison means including a current mirror circuit coupled to receive said internal high voltage for supplying a current flow, for comparing said reference voltage with a voltage on a first node, a current driving element responsive to an output signal of said differential comparison means for supplying current from said internal high voltage supply node to a second node, a plurality of diode-connected insulated gate type field effect transistors connected in series between said first node and said second node, and a source follower transistor coupled between said internal high voltage supply node and the control electrode of said drive transistor and having its gate receiving a voltage on said second node.

6. The semiconductor memory device according to claim 1, further comprising:

a capacitance element, responsive to an internal circuitry operation instruction signal instructing an operation of an internal circuitry that includes said prescribed internal circuit, for supplying electric charges to said control electrode of said drive transistor.

7. The semiconductor memory device according to claim 1, further comprising:

a plurality of power supply pads for receiving an externally applied power supply voltage to supply said external power supply voltage, wherein a combination of said driving voltage generating circuit and said drive transistor forms an internal voltage down-converter, and said internal voltage down-converter is located corresponding to each of said plurality of power supply pads, and the power supply node is coupled to a corresponding power supply pad.

8. The semiconductor memory device according to claim 1, further comprising:

a data output transistor coupled between a ground node and a data output terminal; and an output driving circuits, operating with said external power supply voltage as one operating power supply voltage, for receiving internal read data, generating a potential corresponding to the received internal read data for application to a control electrode node of said data output transistor.

9. The semiconductor memory device according to claim 8, wherein said output driving circuit includes:

an insulated gate type field effect transistor coupled between a first internal power supply node and a power supply node to which said external power supply voltage is applied, and having its gate receiving said internal high voltage, a level converting means for converting one potential level of said internal read data to a level of said external power supply voltage, a driver operating with voltage on said first internal power supply node as one operating power supply voltage for forming a voltage to be applied to the control electrode node of said data output transistor in accordance with an output voltage of said level converting means.

10. The semiconductor device according to claim 1, further comprising:

a memory array including a plurality of memory cells arranged in rows and columns, and a plurality of word lines arranged corresponding to respective rows of memory cells, and wherein said internal high voltage is transmitted onto a selected word line out of said plurality of word lines.

11. The semiconductor device according to claim 1, further comprising:

first and second memory arrays each including a plurality of memory cells arranged in rows and columns, a plurality of sense amplifiers shared between said first and second memory arrays and provided corresponding to the columns of memory cells for sensing and amplifying data signals on corresponding columns, first connection gate means provided between the columns of said first memory array and said plurality of sense amplifiers, and second connection gate means provided between the columns of said second memory array and said plurality of sense amplifiers, and wherein said internal high voltage is used for controlling conduction of said first and second connection means.

12. The semiconductor device according to claim 6, further comprising a constant current source coupled to receive the external power supply voltage for producing a constant current flow, means for converting said constant current flow into a voltage signal, and means responsive to said voltage signal and said internal circuitry operation instruction signal for discharging the control electrode when said internal circuitry operation instruction signal is inactive.

13. The semiconductor device according to claim 6, further comprising:

a memory array including a plurality of memory cells arranged in rows and columns, and signal generation means, coupled to receive an address signal designating a memory cell in said memory cell array, a first signal instructing a row selection operation, and a second signal instructing a column selection signal, for detecting a transition in any of said address signal, the first signal and the second signal to produce a pulse signal for a predetermined period as said internal circuitry operation instruction signal upon each detection of the transition.

14. The semiconductor device according to claim 1, further comprising:

an internal voltage node receiving an internal voltage having an absolute value larger than that of said internal power supply voltage;

read means coupled to receive internal read data for generating first and second data signals complementary to each other from the received internal read data when being activated;

first driving means operating with the internal power supply voltage on said internal power supply node as one operating power supply voltage, for receiving said first data signal, and generating a first driving voltage corresponding to the received first data;

second driving means operating with the external power supply voltage on said external power supply node as one operating power supply voltage, for receiving said second data signal, and generating a second driving voltage corresponding to the received second data, and complementary in logic to said first driving voltage and having one level determined by said internal voltage;

a first drive transistor coupled between said external power supply node and a data output node, and responsive to said first driving voltage for transmitting voltage on said external power supply node to said data output node; and a second drive transistor coupled between said data output node and a third power supply node for receiving another power supply voltage which is different in logic from voltages on said external and internal power supply nodes, and responsive to said second driving voltage for conducting complementarily to said first drive transistor and transmitting the voltage on said third power supply node to said data output node.

15. The semiconductor device according to claim 14, wherein said first driving means includes:

a diode element coupled between said internal power supply node and a first node, boosting means for transmitting said first data signal to said first node through a charge pumping operation, and a first driving circuit operating with the voltage on said first node as one operating power supply voltage, for buffering said first data signal to transmit the buffered data to a control electrode node of said first drive transistor, and said second driving means includes:

an insulated gate type field effect transistor coupled between said external power supply node and a second node and having its gate receiving internal voltage on said internal voltage node, level converting means operating with voltage on said external power supply node as one operating power supply voltage, for converting one level of said second data into a level of said external power supply voltage, and a second driving circuit operating with the voltage on said second node as one operating power supply voltage, for buffering output voltage of said level converting means, forming voltage complementary in logic to an output voltage of said first driving circuit, and applying the formed voltage to a control electrode node of said second drive transistor.

16. A semiconductor device, comprising:

an external power supply node receiving an external power supply voltage;

an internal power supply node receiving an internal power supply voltage obtained by level conversion of said external power supply voltage;

an internal voltage node receiving an internal voltage whose absolute value is larger than that of said internal power supply voltage;

read means coupled to receive internal read data for generating first and second data signals which are complementary to each other from the received internal read data when being activated;

first driving means operating with the internal power supply voltage on said internal power supply node as one operating power supply voltage, for receiving said first data signal, and generating a first driving voltage corresponding to the received first data;

second driving means operating with the external power supply voltage on said external power supply node as one operating power supply voltage, for receiving said second data, and generating a second driving voltage corresponding to the received second data, complementary in logic to said first driving voltage and having one level determined by said internal voltage;

a first drive transistor coupled between said external power supply node and a data output node, and responsive to said first driving voltage for transmitting the voltage on said external power supply node to said data output node; and a second drive transistor coupled between said data output node and a third power supply node for receiving a power supply voltage which is different in logic from voltages on said external and internal power supply nodes, and responsive to said second driving voltage for conducting complementarily to said first drive transistor and transmitting the voltage on said third power supply node to said data output node.

17. The semiconductor device according to claim 16, wherein said first driving means includes a diode element coupled between said internal power supply node and a first node, boosting means for transmitting said first data signal to said first node through charge pumping operation by capacitive coupling, and a first driving circuit operating with a voltage on said first node as one operating power supply voltage for buffering said first data signal to transmit the buffered data to a control electrode node of said first drive transistor, and said second driving means includes an insulated gate type field effect transistor coupled between said external power supply node and a second node and having its gate receiving the internal voltage on said internal voltage node, level converting means operating with the voltage on said external power supply node as one operating power supply voltage for converting one level of said second data signal into a level of said external power supply voltage, and a second driving circuit operating with the voltage on said second node as one operating power supply voltage, for buffering an output voltage of said level converting means, forming a voltage complementary in logic to the output voltage of said first driving circuit, and applying the formed voltage to a control electrode node of said second drive transistor.

18. The semiconductor memory device according to claim 1, wherein said drive transistor is configured to operate in a source follower mode.

19. The semiconductor memory device according to claim 1, wherein said drive transistor is configured to supply electric charges in accordance with a difference between said driving voltage and the internal power supply voltage on said internal power supply node.

* * * * *